(12) United States Patent
Inamori et al.

(10) Patent No.: US 7,439,808 B2
(45) Date of Patent: Oct. 21, 2008

(54) HIGH-FREQUENCY POWER AMPLIFIER

(75) Inventors: Masahiko Inamori, Osaka (JP); Kazuki Tateoka, Kyoto (JP); Hirokazu Makihara, Osaka (JP); Singo Matsuda, Kyoto (JP); Kenta Matsui, Osaka (JP); Singo Enomoto, Osaka (JP); Haruhiko Koizumi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 89 days.

(21) Appl. No.: 11/710,898

(22) Filed: Feb. 27, 2007

(65) Prior Publication Data

US 2007/0222520 A1    Sep. 27, 2007

(30) Foreign Application Priority Data

Mar. 22, 2006    (JP)    ............... P.2006-079277

(51) Int. Cl.
   *H03F 3/04*    (2006.01)
(52) U.S. Cl. ..................... 330/289; 330/296

(58) Field of Classification Search .............. 330/207 P, 330/285, 289, 296, 298
See application file for complete search history.

(56) References Cited

U.S. PATENT DOCUMENTS

| 6,922,107 | B1 * | 7/2005 | Green ..................... 330/296 |
| 6,992,524 | B2 * | 1/2006 | Yang et al. ................ 327/540 |
| 7,154,336 | B2 * | 12/2006 | Maeda ..................... 330/285 |
| 7,310,015 | B2 * | 12/2007 | Jeon et al. ................. 327/538 |
| 7,358,817 | B2 * | 4/2008 | Kao et al. .................. 330/296 |

FOREIGN PATENT DOCUMENTS

| JP | 2003-347850 A | 12/2003 |
| JP | 2004-40500 A | 2/2004 |

* cited by examiner

*Primary Examiner*—Henry K Choe
(74) *Attorney, Agent, or Firm*—McDermott Will & Emery LLP

(57) ABSTRACT

A high-frequency power amplifier with a temperature compensation function for power amplifying a high-frequency signal, includes: a power amplifying transistor having an emitter grounded; a high power output bias circuit that supplies a high power output current corresponding to a high power output of the high-frequency power amplifier to the power amplifying transistor; and a low power output bias circuit that supplies a low power output current corresponding to a low power output of the high-frequency power amplifier to the power amplifying transistor.

12 Claims, 15 Drawing Sheets

HIGH-FREQUENCY POWER AMPLIFIER

BACKGROUND

The present invention relates to a high-frequency power amplifier which is used in an apparatus for transmitting and receiving a high-frequency signal.

Recently, in a cellular phone terminal of a digital system (for example, UMTS: Universal Mobile Transmission Standard), the performance enhancement and size reduction thereof has been an important factor and thus a high-frequency power amplifier, which is used in such cellular phone terminal for amplifying the power of a high power output, has been requested to be compact in size as well as to be able to provide high efficiency and low distortion.

The power amplifier is a part which occupies one half of the power consumption of the cellular phone terminal and thus, in order to extend the talk time of the cellular phone terminal, it is indispensable that the power amplifier can be operated with high efficiency. As an index of the efficiency of the power amplifier, power added efficiency (PAE: Power Added Efficiency) is used.

Generally, the output power of the power amplifier extends in a wide range of about +30 dBm to −50 dBm. Especially, in the vicinity of +30 dBm where the output power is greatest, the power consumption of the power amplifier is greatest and, therefore, it is necessary for the power amplifier to be able to provide a high power added efficiency.

On the other hand, the probability density function (PDF: Probability Density Function) of the power amplifier, which shows the frequency of use of the output power of the power amplifier, is highest in the range of +21 dBm to +11 dBm while the vicinity of +16 dBm, which is a relatively low power output, provides a peak value. In this range, although the power consumption is not so high, since the frequency of use is high, it is important to enhance the power added efficiency in this range as well.

In view of the above, in the patent reference 1, 2 and the like, there is proposed a conventional high-frequency power amplifier which can set the power added efficiency high in such low power output time. In a high-frequency power amplifier disclosed in the patent reference 1, in the high power output time, a bias circuit and a bias current control circuit supply a base current to the base of the power amplifying transistor of an RF amplifier, whereas in the low power output time, the bias current control circuit is switched to thereby cut off the component of the base current supplied from the bias current control circuit and thus the base current is supplied to the base of the power amplifying transistor of the RF amplifier only from the bias circuit, whereby the collector current of the power amplifying transistor is reduced to thereby set the power added efficiency high.

FIG. 15 shows an example of a circuit used in a conventional high-frequency power amplifier 100 in which a bias circuit and a bias current control circuit are connected parallel to an RF amplifier. In FIG. 15, a direct-current bias voltage DC is applied to the base of the power amplifying transistor of an RF amplifier 101 from a bias circuit 102 and a bias current control circuit 103, and a high-frequency signal RF is input through a capacitor C101 to the base of the power amplifying transistor of the RF amplifier 101. An amplifying signal to be output from the collector of the power amplifying transistor of the RF amplifier 101 is output through a capacitor C102.

In the circuit configuration shown in FIG. 15, in the high power output time, in order that a current can be supplied to the base of the power amplifying transistor of the RF amplifier 101, the reference voltage apply terminal Vref of the bias circuit 102 is set equal to or higher than a voltage of 2.5 V, and also in order that a current can be supplied to the base of the power amplifying transistor of the RF amplifier 101 from the bias current control circuit 103 as well, the control voltage apply terminal Vcon of the bias current control circuit 103 is set in the range of 2.8~3.3 V.

On the other hand, in the low power output time, while the reference voltage apply terminal Vref of the bias circuit 102 remains set equal to or higher than the voltage of 2.5 V, the control voltage apply terminal Vcon of the bias current control circuit 103 is set in the range of 0~0.5 V, whereby a diode D103 used in the bias current control circuit 103 is turned off and the collector voltage of an active bias transistor HBT2 used in the bias current control circuit 103 becomes higher than the voltage of the bias terminal Vcon, thereby cutting off the emitter current of the active transistor HBT, that is, the base current to the power amplifying transistor of the RF amplifier 101.

Therefore, by supplying the base current to the power amplifying transistor of the RF amplifier 101 only from the bias circuit 102, the collector current can be reduced and the power added efficiency can be set high.

Patent Reference 1: Japanese Patent Publication 2003-347850
Patent Reference 2: Japanese Patent Publication 2004-40500

However, when the above-structured conventional high-frequency power amplifier 100 is used in an apparatus for transmitting and receiving a high-frequency signal, there is a fear that the following influences can be incurred in the apparatus when the peripheral temperature of the apparatus varies.

For example, in the cellular phone system of UMTS system, communication is executed by diffusing a signal spectrum and giving a specific sign to data on the diffused signal spectrum. Therefore, signals to be transmitted from the respective cellular phone terminals within the same cell respectively must be a constant input when they are received in a base station.

In other words, even when neither the movement of a cellular phone terminal nor the radio condition change thereof is made but the peripheral temperature thereof varies, the outputs to be transmitted from the high-frequency power amplifier used in the cellular phone terminal must be constant. Specifically, the output power from the cellular phone terminals with respect to the output set values of the signal information received from the base station in the range of the peripheral temperature of −10° C. to +55° C. must be equal to or less than ±1 dB.

FIG. 16 shows the collector current characteristics of high and low power output modes in an idle time with respect to variations in the peripheral temperature of the above-structured conventional high-frequency power amplifier 100. In order to reduce the variations in the output power of the high-frequency power amplifier 100 with respect to the temperature variations, it is quite important to reduce variations in the collector current in the idle time. In order to make the output power be equal to or less than ±1 dB in the range of the peripheral temperature of −10° C. to +55° C., it is indispensable to control the variations in the collector current in the idle time to ±20% or less.

Therefore, the variations in the collector current in the idle time in the high power output mode, as shown in FIG. 16, are set in the range of 180 mA (at the time of −10° C.) to 220 Am (+55° C.) so as to control the variations in the collector current substantially to the range of −10%~+10% with respect to 200 mA at the time of +25° C.

In other words, when the peripheral temperature varies, variations in the inter-base-emitter voltage Vbe of the power amplifying transistor of the RF amplifier 101 and variations in the inter-base-emitter voltage Vbe of the active bias transistors HBT1, HBT2 are compensated by the temperature compensation circuit using the forward voltages Vf of a resistor Rb and diodes D101, D102 respectively provided in the bias circuit 102 to thereby control the variations in the base current of the power amplifying transistor of the RF amplifier 101.

Now, FIG. 17 shows output power (power gain) characteristics in a high power output mode (28 dBm) and in a low power output mode (16 dBm) with respect to variations in the peripheral temperature when the above-mentioned conventional high-frequency amplifier 100 is used in the rear stage of a cascade-type two-stage power amplifier.

In the peripheral temperature range of −10° C. to +55° C., in the high power output mode, as described above, because the variations in the collector current is controlled to or less than ±20%, the output power of the high-frequency power amplifier 100 varies from 27.3 dBm to 28.3 dBm, that is, the output power can be controlled to or less than ±1 dB. Therefore, even without adjusting the output power from outside, the talk quality of the cellular phone terminal can be prevented against deterioration.

On the other hand, in the low power output mode, the base current from the active bias transistor HBT2 in the bias current control circuit 103 to the power amplifying transistor in the RF amplifier 101 is cut off; and, variations in the voltage due to the temperatures of the inter-base-emitter voltage Vbe of the power amplifying transistor of the RF amplifier and the inter-base-emitter voltage Vbe of the active bias transistor HBT1 differ from those in the high power output mode, whereas the compensation voltage width of the temperature compensation circuit due to the forward voltage Vf of the resistor Rb and diodes D101, D102 respectively provided in the bias circuit 102 is the same as that in the high power output mode, which makes it impossible to provide sufficient temperature compensation.

Accordingly, variations in the base current of the power amplifying transistor of the RF amplifier 101 increase and, as shown in FIG. 16, the collector current in the idle time varies in the range of 9 mA (at the time of −10° C.) to 110 mA (at the time of 55° C.), so that the collector current variation with respect to 84 mA has a width in the range of −89%~+31%, which is larger than the width of ±20%.

Therefore, as shown in FIG. 17, for the peripheral temperature range of −10° C. to +55° C., in the low power output mode, the output power of the high-frequency power amplifier 100 is 16.0 dBm in the vicinity of a room temperature, but it reduces down to about 15.0 dBm at the time of +55° C. and further reduces down to 12.0 dBm at the time of −10° C. That is, in the peripheral temperature range of −10° C. to +55° C., in the low power output mode, the output power of the high-frequency power amplifier 100 varies in such a manner that it exceeds greatly the range of 16 dBm ±1 dBm.

As described above, when the transmission output from the high-frequency power amplifier used in the cellular phone terminal varies greatly with the variation in the peripheral temperature, the level of a receiving signal at the base station differs from that of the other remaining cellular phone terminals and, because of the leakage of the power to an adjoining channel, the signal cannot be demodulated properly, resulting in the deteriorated talk quality.

In order to avoid this problem, generally, a method in which a cellular phone terminal is structured to have an output adjust function which can solve such problem is employed. However, when the temperature characteristics of the power amplifier vary greatly due to such output power, it is necessary to provide a temperature compensation table specially, which incurs an increase in the memory of the cellular phone terminal. As a result of this, there arises a possibility that the loading area of the cellular phone terminal and the cost thereof can increase.

SUMMARY

The invention aims at eliminating the above problems found in the conventional high-frequency power amplifier. Thus, it is an object of the invention to provide a high-frequency power amplifier which, even when the temperature varies, can realize a high-efficiency operation over a wide range of the output power thereof.

[Means for Solving the Problems]

A high-frequency power amplifier according to the invention is a high-frequency power amplifier with a temperature compensation function for power amplifying a high-frequency signal, comprising: a power amplifying transistor having an emitter grounded; a high power output bias circuit for supplying a high power output current corresponding to a high power output to the power amplifying transistor; and a low power output bias circuit for supplying a low power output current corresponding to a low power output to the power amplifying transistor. According to the above structure, the high and low power output bias circuits are provided separately from each other, and a base current corresponding to the output power is supplied to the power amplifying transistor, thereby being able to control the collector current of the power amplifying transistor to a minimum according to the output power. Therefore, even when the temperature varies, a high-efficiency operation can be realized over a wide range of output power.

The high-frequency power amplifier according to the invention further includes: a capacitor having one electrode capable of receiving a high-frequency signal and the other electrode connected to the base of the power amplifying transistor; and, a capacitor having one electrode connected to the collector of the power amplifying transistor and the other electrode capable of outputting a high-frequency signal. In the thus structured high-frequency power amplifier, the high power output bias circuit has a first electrode connected to a first reference voltage apply terminal, a second electrode connected to a bias voltage apply terminal, and a third electrode connected to the base of the power amplifying transistor; and, the low power output bias circuit has a fourth electrode connected to a second reference voltage apply terminal, a fifth electrode connected to the bias voltage apply terminal, and a sixth electrode connected to the base of the power amplifying transistor.

In the high-frequency power amplifier according to the invention, the high output bias circuit includes a first temperature compensation circuit for compensating the temperature of the high power output current and a first biasing transistor for supplying the temperature compensated high power output current to the base of the power amplifying transistor; and, the low power output bias circuit includes a second temperature compensation circuit for compensating the temperature of the low power output current and a second biasing transistor for supplying the temperature compensated low power output current to the base of the power amplifying transistor. According to the above structure, by switching the voltages of the first and second reference voltage apply terminals, for the high power output time, the power amplifying transistor can be operated by the first biasing transistor, for the temperature varying time during the high power output time, the temperature of the idle current of the power amplifying transistor can be compensated by the first temperature compensation circuit, for the low power output time, the power amplifying transistor can be operated by the second biasing transistor, and, for the temperature varying time during the low power output time, the temperature of the idle current of the power amplifying transistor can be compensated by the second temperature compensation circuit. That is, since the variation in the collector current of the power amplifying transistor when the temperature varies can be controlled, there can be provided a high-frequency power amplifier which little depends on the temperature variation but can easily provide a stable output power characteristic free from the output power variation.

In the high-frequency power amplifier according to the invention, the idle current of the power amplifying transistor to be operated by the second biasing transistor in the low power output time is smaller than the idle current of the power amplifying transistor to be operated by the first biasing transistor in the high power output time.

In the high frequency power amplifier according to the invention, the coefficient of variation in the idle current of the power amplifying transistor to be compensated by the first temperature compensation circuit when the temperature of the high power output varies is equivalent to the coefficient of variation in the idle current of the power amplifying transistor to be compensated by the second temperature compensation circuit when the temperature of the low power output varies.

In the high-frequency power amplifier according to the invention, the first temperature compensation circuit includes a resistor connected between the first reference voltage apply terminal and the base of the first biasing transistor, and first and second diodes connected in series to each other, each diode having an anode connected to the base of the first biasing transistor and a cathode grounded; the first biasing transistor has a collector connected to the bias voltage apply terminal and an emitter connected to the base of the power amplifying transistor; the second temperature compensation circuit includes a resistor connected between the second reference voltage apply terminal and the base of the second bias transistor, and third and fourth diodes connected in series to each other, each diode having an anode connected to the base of the second biasing transistor and a cathode grounded; and, the second biasing transistor has a collector connected to the bias voltage apply terminal and an emitter connected to the base of the power amplifying transistor.

In the high-frequency power amplifier according to the invention, at least one of the following two coefficients of variation is small: that is, the coefficient of variation in the idle current of the power amplifying transistor to be compensated by the first temperature compensation circuit when output power is high output power and a reference voltage varies; and, the coefficient of variation in the idle current of the power amplifying transistor to be compensated by the second temperature compensation circuit when the output power is low output power and the reference voltage varies. According to the above structure, since the dependency on the reference voltage of at least one of the first and second temperature compensation circuits is small, the stability of the high-frequency power amplifier with respect to a variation in the reference voltage can be enhanced.

The high-frequency power amplifier according to the invention further includes a capacitor having one electrode capable of receiving a high-frequency signal and the other electrode connected to the base of the power amplifying transistor, and a capacitor having one electrode connected to the collector of the power amplifying transistor and the other electrode capable of outputting a high-frequency signal. In the high-frequency power amplifier, the high output bias circuit has one electrode connected to the first reference voltage apply terminal and the other electrode connected to the base of the power amplifying transistor; and, the low power output bias circuit has one electrode connected to the second reference voltage apply terminal and the other electrode connected to the base of the power amplifying transistor.

In the high-frequency power amplifier according to the invention, the high power output bias circuit includes a first temperature compensation circuit for compensating the temperature of the high power output current and a first biasing transistor for supplying the temperature compensated high power output current to the base of the power amplifying transistor; and, the low power output bias circuit includes a second temperature compensation circuit for compensating the temperature of the low power output current and a second biasing transistor for supplying the temperature compensated low power output current to the base of the power amplifying transistor. According to the above structure, by switching the voltages of the first and second reference voltage apply terminals, for the high power output time, the power amplifying transistor can be operated by the first biasing transistor, for the temperature varying time during the high power output time, the temperature of the idle current of the power amplifying transistor can be compensated by the first temperature compensation circuit, for the low power output time, the power amplifying transistor can be operated by the second biasing transistor, and, for the temperature varying time during the low power output time, the temperature of the idle current of the power amplifying transistor can be compensated by the second temperature compensation circuit.

In the high-frequency power amplifier according to the invention, the idle current of the power amplifying transistor to be operated by the second biasing transistor in the low power output time is smaller than the idle current of the power amplifying transistor to be operated by the first biasing transistor in the high power output time.

In the high-frequency power amplifier according to the invention, the coefficient of variation in the idle current of the power amplifying transistor to be compensated by the first temperature compensation circuit when the temperature of the high power output varies is equivalent to the coefficient of variation in the idle current of the power amplifying transistor to be compensated by the second temperature compensation circuit when the temperature of the low power output varies.

In the high-frequency power amplifier according to the invention, the driving of the power amplifying transistor is controlled by applying a voltage to the first and second reference voltage apply terminals. According to the above structure, since the number of voltage systems to be controlled can be reduced to two, the scale of the circuit can be reduced. Therefore, the actual mounting area and cost of a cellular phone terminal incorporating this high-frequency amplifier therein can be reduced. The control of the high-frequency power amplifier can be simplified, there is eliminated the need for provision of a control correction table within a cellular phone terminal, which makes it possible to reduce the size of the memory of the cellular phone terminal.

According to the invention, even for the temperature varying time, by controlling the bias circuit according to the high and low power output times over a wide range of the output power of the power amplifier, there can be provided a high power added efficiency. By adding temperature compensation circuits to the high and low power output bias circuits respectively, the variation in the collector current of the power amplifying transistor in the temperature varying time can be controlled and, therefore, there can be provided a power amplifier which, free from the variation in the output power, little depends on the temperature but can provide a stable output power characteristic easily.

DESCRIPTION OF EMBODIMENTS

First Embodiment

Figure 1:
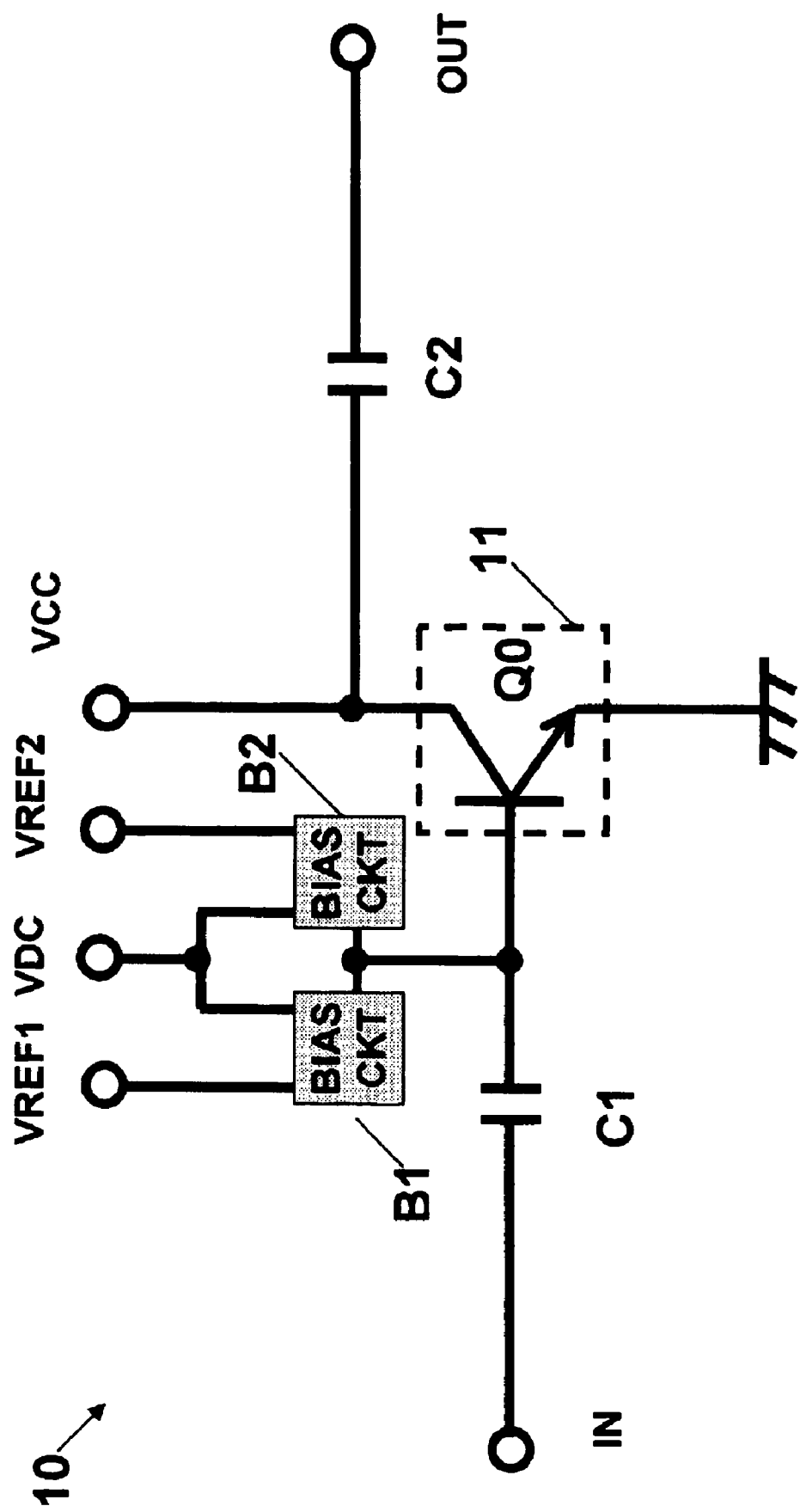
FIG. 1 is a circuit diagram of a circuit configuration of a high-frequency power amplifier 10 according to a first embodiment of the invention.
Figure 2:
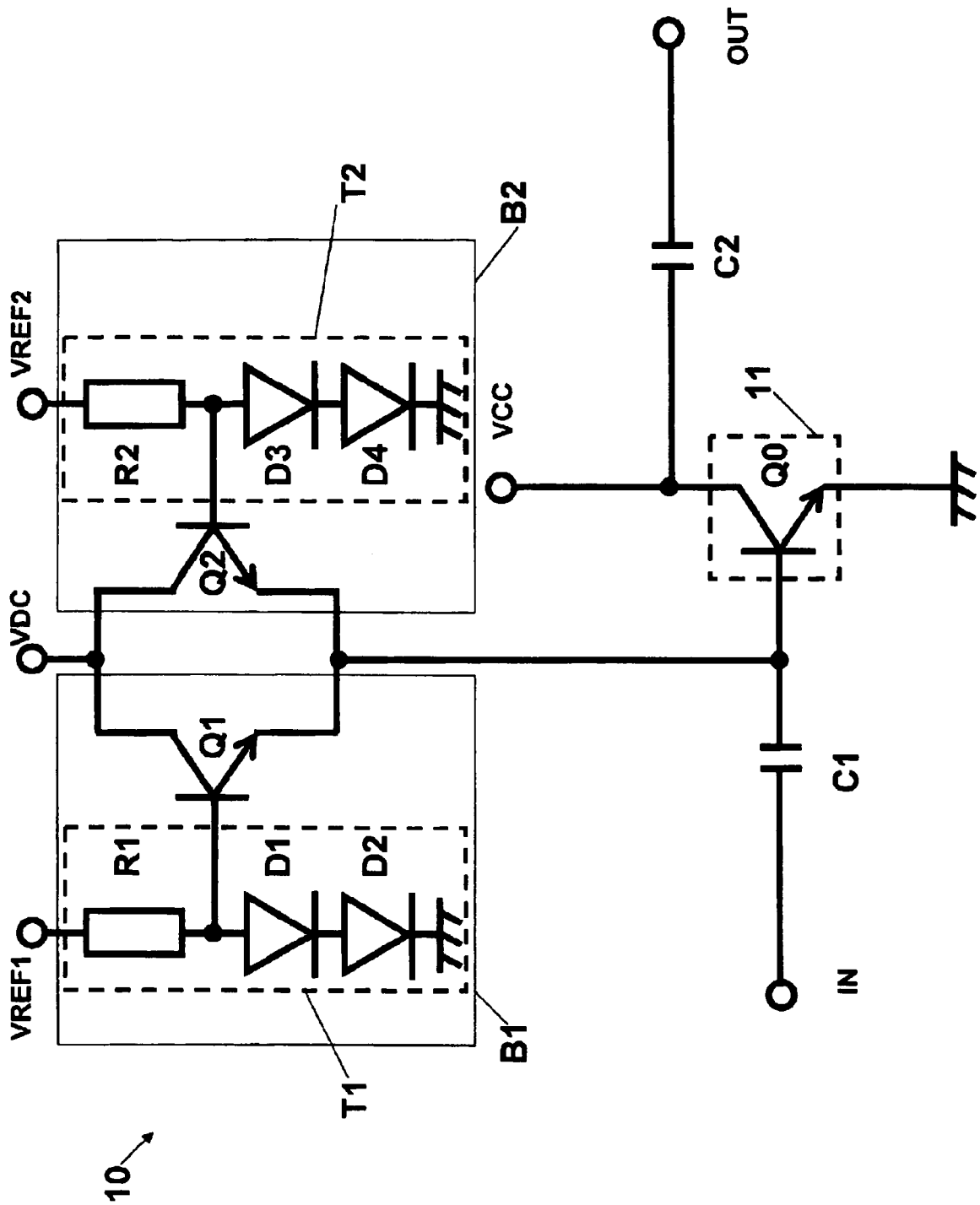
FIG. 2 is a circuit diagram of a circuit configuration (the details of a bias circuit) of a high-frequency power amplifier 10 according to a first embodiment of the invention.
Figure 3:
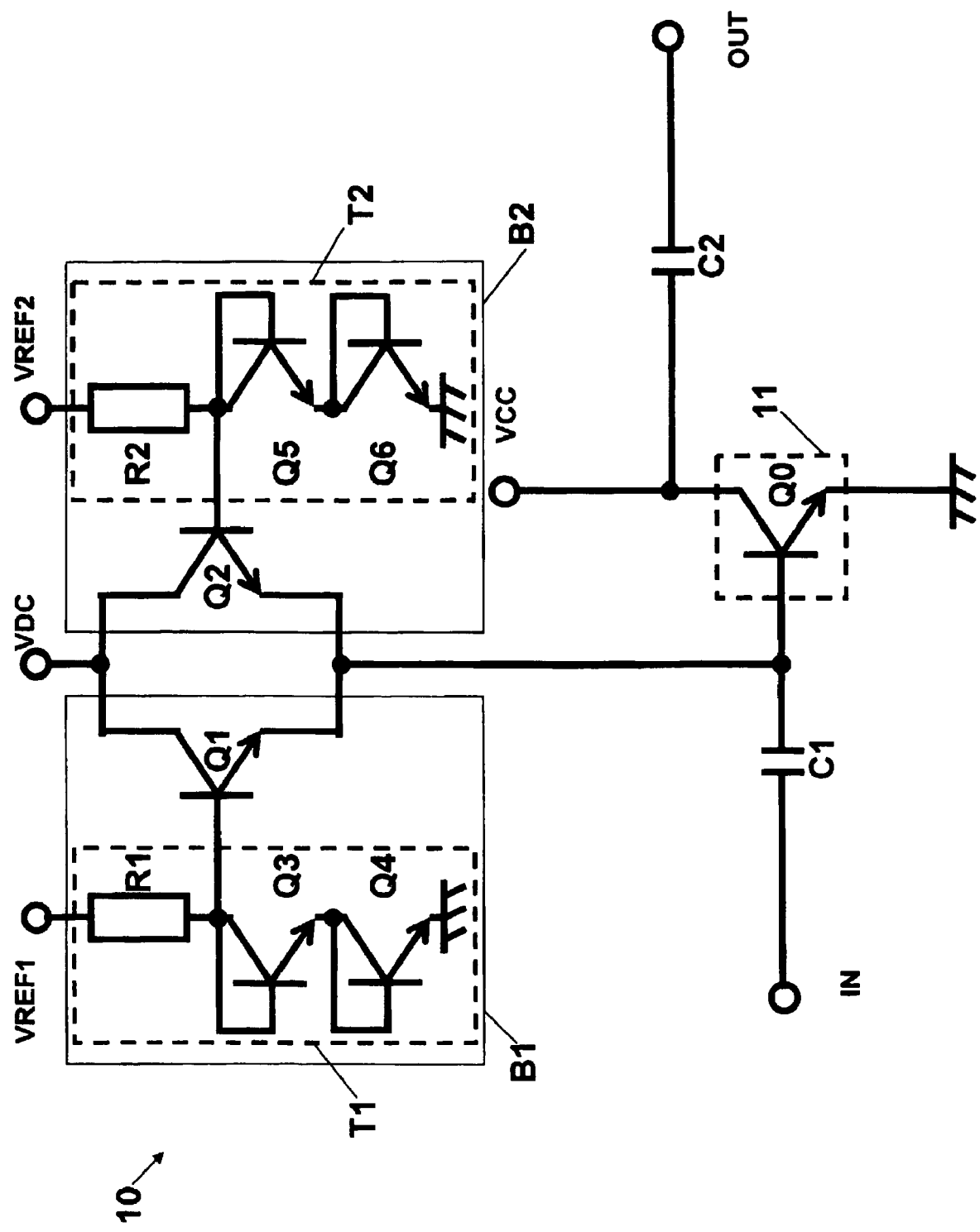
FIG. 3 is a circuit diagram of a circuit configuration (details of a temperature compensation circuit) of a high-frequency power amplifier 10 according to a first embodiment of the invention.

FIGS. 1 to 3 are respectively views of an example of a circuit configuration of a high-frequency power amplifier 10 with a temperature compensation function according to a first embodiment of the invention. Now, description will be given below of the structure and operation of the high-frequency power amplifier 10 according to the first embodiment of the invention with reference to FIGS. 1 to 6.

In FIG. 1, the high-frequency power amplifier 10 includes an RF amplifier 11, a high power output bias circuit B1, a low power output bias circuit B2, and capacitors C1, C2. A high-frequency signal is connected through the capacitor C1 to the base of the power amplifying transistor Q0 of the RF amplifier 11. A reference voltage apply terminal VREF1 and a reference voltage apply terminal VREF2 are connected to the base of the power amplifying transistor Q0 of the RF amplifier 11 through the high power output bias circuit B1 and through the low power output bias circuit B2, respectively. A bias voltage VDC is connected in common to the respective bias circuits B1 and B2. The collector of the power amplifying transistor Q0 outputs a high-frequency signal through the capacitor C2, while the emitter of the transistor Q0 is grounded.

FIG. 2 shows the details of the respective bias circuits B1, B2 of the high-frequency power amplifier 10 shown in FIG. 1. The high power output bias circuit B1 is composed of a temperature compensation circuit T1 including a resistor R1 and two diodes D1, D2 connected in series, and a biasing transistor Q1. A reference voltage VREF1 is applied to the resistor R1, the cathode of the diode D2 is grounded, the base of the biasing transistor Q1 is connected to a connecting point between the resistor R1 and diode D1, the voltage of a bias voltage VDC is applied to the collector of the biasing transistor Q1, the emitter of the biasing transistor Q1 is connected to the power amplifying transistor Q0.

The low power output bias circuit 21 is composed of a temperature compensation circuit T2 including a resistor R2 and two diodes D3, D4 connected in series, and a biasing transistor Q2. A reference voltage VREF2 is applied to the resistor R2, the cathode of the diode D4 is grounded, the base of the biasing transistor Q2 is connected to a connecting point between the resistor R2 and diode D3, the voltage of the bias voltage VDC is applied to the collector of the biasing transistor Q2, the emitter of the biasing transistor Q2 is connected to the power amplifying transistor Q0.

Here, the voltage of the bias voltage VDC is applied to the collectors of the biasing transistors Q1, Q2, these collectors are connected directly to each other, while the emitters of the biasing transistors Q1, Q2 are connected to the power amplifying transistor Q0 and these emitters are connected directly to each other.

FIG. 3 shows the specific examples of the respective diodes D1, D2, D3 and D4 included in the temperature compensation circuits T1 and T2 provided in the high-frequency power amplifier 10 shown in FIG. 2. The diodes D1, D2, D3 and D4 can be structured by shorting between the bases and collectors of the transistors Q3, Q4, Q5 and Q6 by wiring.

Here, the high and low power output bias circuits B1 and B2 are similar in the circuit configuration, whereas the abilities of the bias circuits B1 and B2 to send a current to the base of the power amplifying transistor Q0 are set different from each other. For example, in the present embodiment, the emitter size of the biasing transistor Q2 is set ¼ of that of the biasing transistor Q1, and the resistance value of the resistor R2 provided within the temperature compensation circuit T2 is set ten times as large as the resistor R1 of the temperature compensation circuit T1, whereby the idle current to be sent from the bias circuit B2 to the base of the power amplifying transistor Q0 can be adjusted to be about ⅛ when compared with the idle current to be sent from the bias circuit B1. By the way, the transistors Q3, Q4, Q5 and Q6 of the temperature compensation circuits T1 and T2 are the same in the emitter size, respectively.

With use of the above-structured structure, the high-frequency power amplifier 10 according to the first embodiment can solve the following two problems.

Firstly, the high power output bias circuit B1, low power output bias circuit B2 and capacitor C1 are connected to the base of the power amplifying transistor Q0 of the RF amplifier 11. Because a base current corresponding to the output power is supplied through the bias circuits B1 and B2 according to either a high power output or a low power output, as the result, the collector current of the power amplifying transistor Q0 can be reduced in the low power output time and thus the power amplifying transistor Q0 can be operated with a high power added efficiency in a wide range of output power.

Next, the temperature compensation circuit T1 is provided in the high power output bias circuit B1 and the temperature compensation circuit T2 is provided in the low power output bias circuit B2. Because a base current corresponding to variations in the peripheral temperature is supplied through the temperature compensation circuits T1 T2 according to either a high power output or a low power output, as the result, variations in the temperature of the collect current of the power amplifying transistor Q0 can be reduced. Therefore, the transmission power can be output stably in a wide range of output power as well as in a wide range of temperature.

In the case of the structure shown in FIG. 3, in order that, in the high power output time, a current can be supplied from the biasing transistor Q1 of the high power output bias circuit B1 to the base of the power amplifying transistor Q0 of the RF amplifier 11, the reference voltage VREF1 of the high power output bias circuit B1 is set equal to or higher than 2.5 V and the bias voltage VDC is set equal to or higher than 1.8 V, whereby a large current (for example, 3 mA or so in the idle time) corresponding to the high power output is allowed to flow to the base of the power amplifying transistor Q0.

At the then time, the reference voltage VREF2 of the low power output bias circuit B2 is set for a voltage of 0V and the transistors Q5 and Q6, which are provided in the temperature compensation circuit T2 and are shorted between the bases and collectors thereof by wiring, are turned off to thereby cut off a current flowing from the biasing transistor Q2 of the low power output bias circuit B2.

On the other hand, in the low power output time, while the bias voltage VDC for use in common with the high output bias circuit B1 is left set at a voltage equal to or higher than 1.8 V, the reference voltage VREF2 of the low power output bias circuit B2 is set at a voltage equal to or higher than 2.5 V, and a small current (for example, about 400 μA in the idle time) which corresponds to the low power output is supplied to the base of the power amplifying transistor Q0.

At the then time, the reference voltage VREF1 of the high power output bias circuit B1 is set at a voltage of 0V and the transistors Q3 and 46, which are provided in the temperature compensation circuit T1 and are shorted between the bases and collectors by wiring, are turned off to thereby cut off a current flowing from the biasing transistor Q1 of the high power output bias circuit B1. Therefore, by supplying the base current of the power amplifying transistor Q0 of the RF amplifier 11 only from the low power output bias circuit T2 having low current supply ability, the collector current can be reduced and thus a power added efficiency can be set high.

Figure 4:
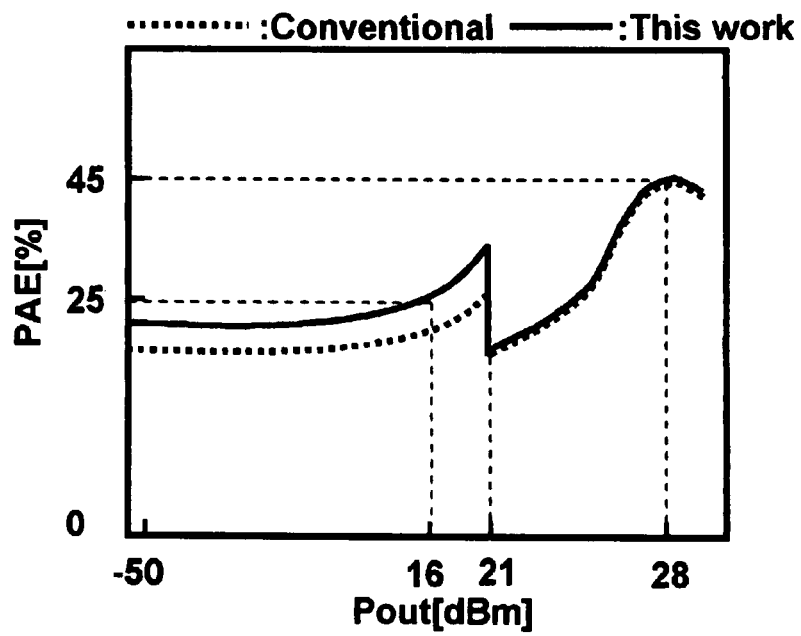
FIG. 4 is a graphical representation of an example of the power added efficiency characteristic of the high-frequency power amplifier 10 shown in FIG. 3.

Now, FIG. 4 shows a power added efficiency characteristic with respect to output power when the high-frequency power amplifier 10 according to the above-mentioned first embodiment of the invention is used in the rear stage of a cascade-type two-stage power amplifier. In the range of 21 dBm~28 dBm of the high power output, a current is supplied from the high power output bias circuit B1 to the power amplifying transistor Q0 to execute the high-frequency power amplification. The power added efficiency provides a peak value when the output power is 45% of 28 dBm, and it lowers as the output power approaches 21 dBm. By switching the high power output bias circuit B1 over to the low power output bias circuit B2 at the time when the output power lowers down to 21 dBm, the collector current of the power amplifying transistor Q0 can be reduced and thus the power added efficiency can be improved from 15% to 30%.

In the range of −50 dBm~21 dBm of the low power output, a current is supplied from the low power output bias circuit B2 to the power amplifying transistor Q0 to execute the high-frequency power amplification. The power added efficiency provides a peak value when the output power is 30% of 21 dBm, and it lowers as the output power approaches −50 dBm.

Especially, in the vicinity of 16 dBm which is used highly frequently in a cellular phone terminal, the power added efficiency provides 25% and thus, when compared with the power added efficiency 20% of the conventional high-frequency power amplifier 101 shown in FIG. 4, the power added efficiency can be enhanced as much as about 5%.

The reason for this is as follows: that is, in the conventional high-frequency power amplifier 101, the emitter size of the biasing transistor (active bias transistor HBT2) to supply a current substantially to the power amplifying transistor is only reduced substantially; and, in the present embodiment, owing to the two effects that not only the emitter size of the biasing transistor is reduced but also the resistance value of the resistor R2 of the temperature compensation circuit T2 is increased to thereby reduce the base current of the biasing transistor Q2, the collector current of the power amplifying transistor Q0 can be reduced greatly and thus the power added efficiency can be improved.

Figure 5:
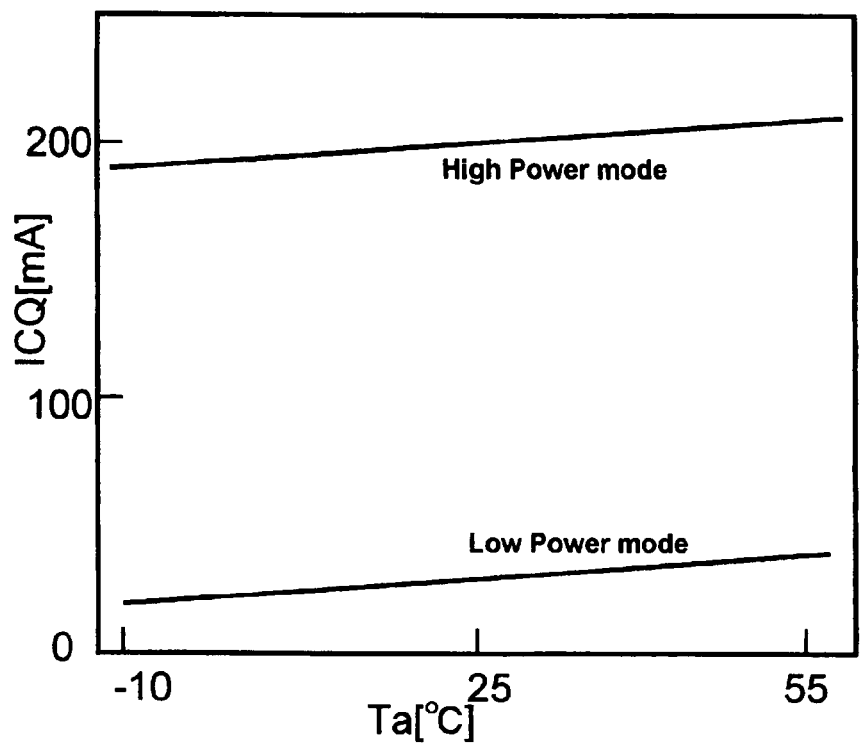
FIG. 5 is a graphical representation of an example of the temperature characteristic of an idle current when the respective bias circuits of the high-frequency power amplifier 10 shown in FIG. 3 are used.

Now, FIG. 5 shows the characteristics of the collector current in the idle time with respect to variations in the peripheral temperature of the high-frequency amplifier 10 according to the above-mentioned first embodiment of the invention, in a high power output mode and in a low power output mode. As has been already described, in the peripheral temperature range of −10° C. to +55° C., in order to set the output power equal to or lower than ±1 dB, it is indispensable to control the variation in the collector current in the idle time to be equal to or lower than ±20%.

Therefore, as shown in FIG. 5, the variation in the collector current in the idle time in the high power output mode is set in the range of 180 mA (at the time of −10° C.) to 220 mA (at the time of +55° C.) to thereby control the variation in the collector current in the range of about −10% to +10% with respect to 200 mA at the time of +25° C.

That is, even when the peripheral temperature varies, the variations not only in the inter-base-emitter voltage Vbe of the power amplifying transistor Q0 of the RF amplifier 11 but also in the inter-base-emitter voltage Vbe of the biasing transistor Q1 are compensated by the temperature compensation circuit T1 using the forward voltage Vf of the resistor R1 and transistors Q3, Q4 respectively provided in the high power output bias circuit B1, thereby controlling the variation in the base current of the power amplifying transistor Q0 of the RF amplifier 11.

Figure 6:
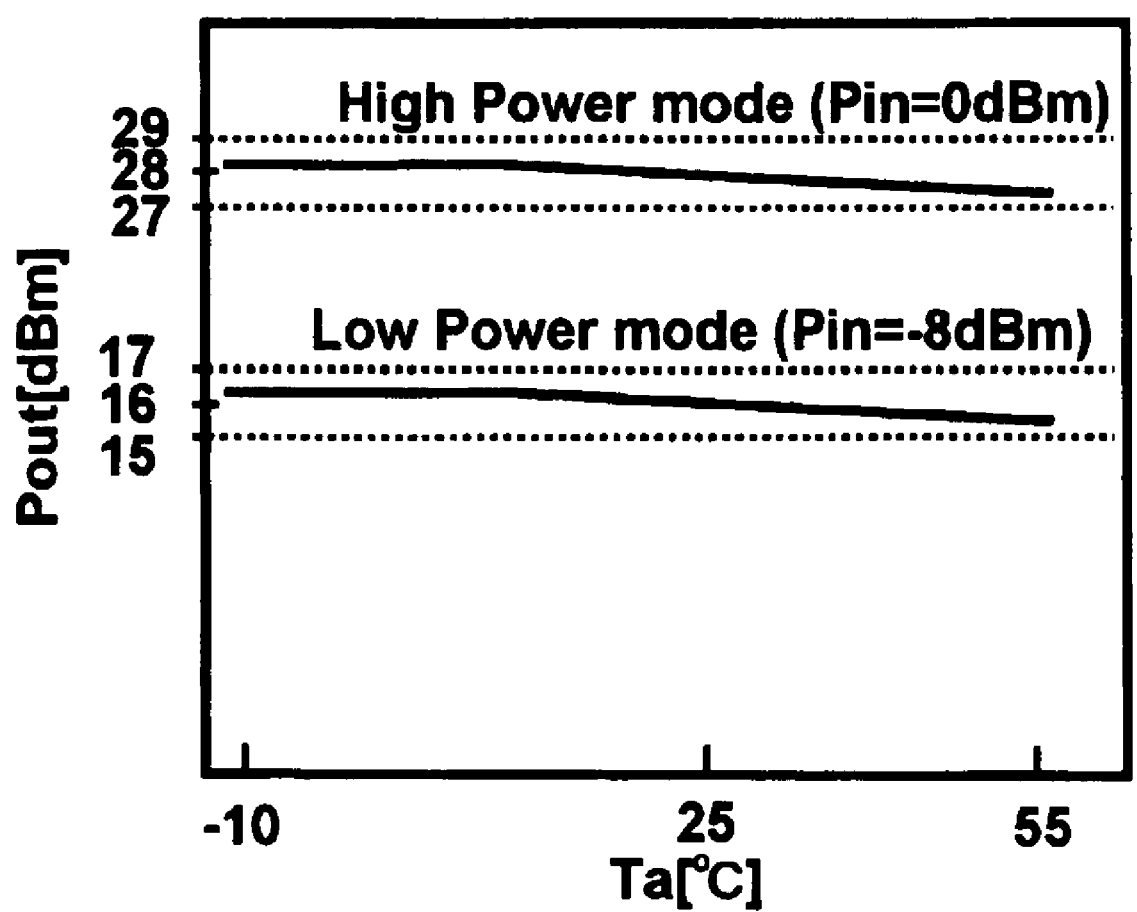
FIG. 6 is a graphical representation of the relationship between the peripheral temperature and output power in the high-frequency power amplifier 10 shown in FIG. 3.

Now, FIG. 6 shows the characteristics of the output power (power gain) with respect to the variation in the peripheral temperature when the above-mentioned high-frequency power amplifier 10 according to the first embodiment of the invention is used in the rear stage of a cascade-type two-stage power amplifier, in a high power output mode (28 dBm) and in a low power output mode (16 dBm).

When the peripheral temperature is in the range of −10° C. to +55° C., in the high power output mode, as described above, since the variation in the collector current is controlled to be equal to or lower than ±20%, the output power of the high-frequency power amplifier 10 varies in the range of 27.3 dBm to 28.3 dBm and thus the variation in the output power can be controlled to be equal to or less than ±1 dB. Therefore, even without adjusting the output power from outside the power amplifier, the deterioration of the talk quality of a cellular phone terminal can be prevented.

In the low power output mode, the variation in the collector current in the idle time, as shown in FIG. 5, is set in the range of 21 mA (at the time of −10° C.) to 29 mA (+55° C.), whereby the variation in the collector current is controlled to be in the range of −15% to +15% with respect to 25 in mA at the time of +25° C.

That is, even when the peripheral temperature varies, the variations not only in the inter-base-emitter voltage Vbe of the power amplifying transistor Q0 of the RF amplifier 11 but also in the inter-base-emitter voltage Vbe of the biasing transistor Q2 are compensated by the temperature compensation circuit T2 using the forward voltage Vf of the resistor R2 and transistors Q5, Q6 respectively provided in the high power output bias circuit B1, thereby controlling the variation in the base current of the power amplifying transistor Q0 of the RF amplifier 11.

Therefore, as shown in FIG. 6, when the peripheral temperature varies in the range of −10° C. to +55° C., in the low power output mode, as described above, since the variation in the collector current is controlled to be equal to or lower than ±20%, the output power of the high-frequency power amplifier 10 varies in the range of 16.5 dBm to 15.5 dBm and thus the variation in the output power can be controlled to be equal to or less than ±1 dB. Therefore, even without adjusting the output from outside the power amplifier, the deterioration of the talk quality of a cellular phone terminal can be prevented.

The reason for the large difference in the variation characteristics of the output power due to the peripheral temperature between the conventional high-frequency power amplifier 101 and the high-frequency power amplifier 10 of the invention is as follows. That is, in the conventional high-frequency power amplifier 101, the emitter size of the biasing transistor for supplying a current to the power amplifying transistor is switched to thereby reduce the collector current, and the compensation voltage provided by the temperature compensation circuit 102 composed of the resistor Rb and diodes D101, D102 is used in such a manner that the emitter size thereof is left large. On the other hand, according to the present embodiment of the invention, the resistance value of the resistor R2 provided in the temperature compensation circuit T2 is increased in correspondence to the reduction of the emitter size of the biasing transistor to thereby adjust the temperature compensation voltage provided by the forward voltage Vf of the resistor R2, and transistors Q5, Q6 before the present power amplifier is used.

As described above, according to a high-frequency power amplifier of the first embodiment of the invention, since the bias circuit is controlled according to the high and low power output times over a wide range of the output power of the power amplifier, a high power added efficiency can be obtained; and, by adding the temperature compensation circuits to the high and low power output bias circuits respectively, the variation in the collector current of the power amplifying transistor can be controlled. Therefore, regardless of the variation in the output power, it is easy to provide the output power characteristic which little depends on the temperature and is stable, whereby a high quality talk is possible in a cellular phone terminal which uses the high-frequency power amplifier according to the invention.

When the temperature characteristic of the power amplifier varies stably according to the output power in this manner, there is eliminated the need for special provision of a temperature compensation table within the cellular phone terminal, which makes it possible to reduce the memory of the cellular phone terminal. As a result of this, there can be expected a high possibility that the actual loading area of the cellular phone terminal and the cost thereof can be reduced.

Second Embodiment

In the structure discussed in the high-frequency power amplifier 10 according to the above-mentioned first embodiment, the temperature compensation circuit T1 is used to correspond to the high power output bias circuit B1, and the temperature compensation circuit T2 is used to correspond to the low power output bias circuit B2, respectively. These temperature compensation circuits T1 and T2 are configured by connecting in series the resistors (R1 and R2) and the cascade-connected two-stage transistors (Q3, Q4 and Q5, Q6), while the reference voltages VREF1 and VREF2 are applied to the temperature compensation circuits T1 and T2, respectively.

However, since the reference voltage is generated by a DA converter made of Si-IC, actually, the reference voltage is supplied with a variation of the order of ±3%. Here, assuming that the reference voltage VREF is set for a voltage 2.8 V, it is supposed that it varies in the range of 2.716 V to 2.884 V. In the variation range of 2.716 V to 2.884 V of the reference voltage VREF, in order to control the output power within ±1 dB, it is indispensable to control a variation in the collector current in the idle time to be equal to or less than ±20%.

In the case of the high-frequency power amplifier 10 using the above-mentioned temperature compensation circuits T1 and T2, the reference voltage VREF is supplied to the base of the biasing transistors (Q1 and Q2) from the connecting points between the resistors (R1 and R2) and cascade-connected two-stage transistors (Q3, Q4 and Q5, Q6).

Figure 8:
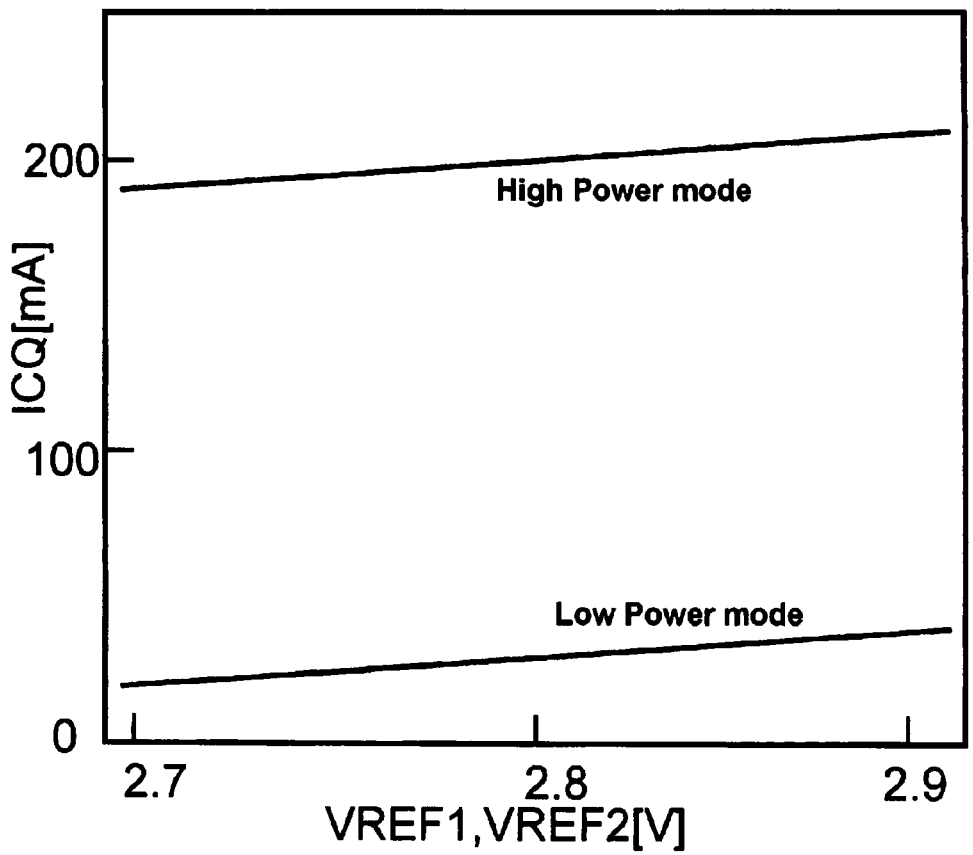
FIG. 8 is a graphical representation of an example of the dependence of an idle current on the reference voltage VREF1, VREF2 when the respective bias circuits of the high-frequency power amplifier 10 shown in FIG. 3 are used.

Therefore, a variation in the collector current in the idle time as shown in FIG. 8 due to variations in the reference voltages VREF1 and VREF2, in the high power output mode, is controlled to be in the range of about −10% to +10% with respect to the range of 180 mA (VREF1=2.716 V) to 220 mA (VREF1=2.884 V) and with respect to 200 mA at the time of VREF1=2.8 V; however, in the low power output mode, the collector current varies in the range of 20 mA (VREF2=2.716

V) to 30 mA (VREF2=2.884 V), that is, it varies in the range of about −20% to +20% with respect to 25 mA at the time of VREF2=2.8 V.

Figure 9:
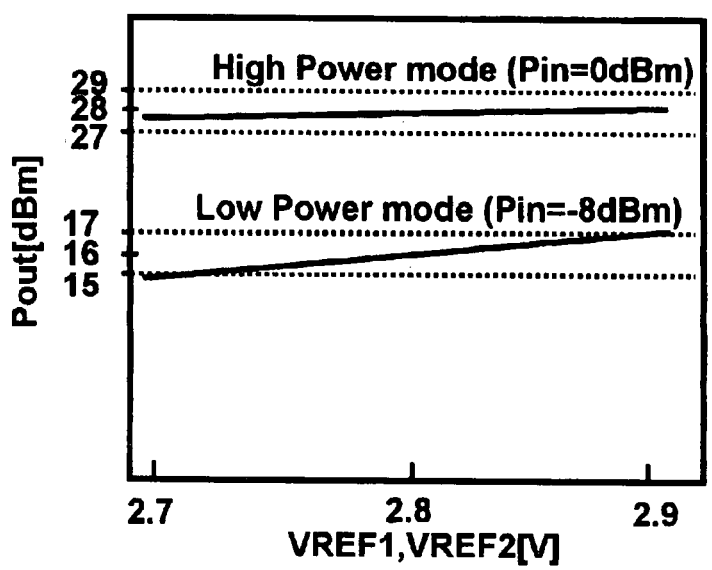
FIG. 9 is a graphical representation of the relationship between the reference voltages VREF1, VREF2 and output power in the high-frequency power amplifier 10 shown in FIG. 3.

Now, FIG. 9 shows output power (power gain) characteristics with respect to variations in the reference voltages VREF1 and VREF2 when the above-mentioned high-frequency power amplifier 10 according to the first embodiment is used in the rear stage of a cascade-connected two-stage power amplifier, in a high power output mode (28 dBm) and in a low power output mode (16 dBm). When the bias voltage varies in the range of 2.716 V to 2.884 V, in the high power output mode, since a variation in the collector current is controlled within ±10%, the output power of the high-frequency power amplifier 10 is allowed to vary in the range of 27.5 dBm to 28.5 dBm, so that the output power can be easily controlled within ±1 dB.

On the other hand, in the low power output mode, a variation in the collector current is ±20% and the output power of the high-frequency power amplifier 10 varies in the range of 15.0 dBm to 17.0 dBm. Therefore, when the peculiar variation and temperature variation in the high-frequency power amplifier 10 are taken into consideration, in some cases, it may be difficult to control the output power within ±1 dB.

In view of the above, in the second embodiment, description will be given below of a high-frequency power amplifier structured such that a temperature compensation circuit little depending on the reference voltage VREF is provided so as to correspond to the bias circuit.

Figure 7A:
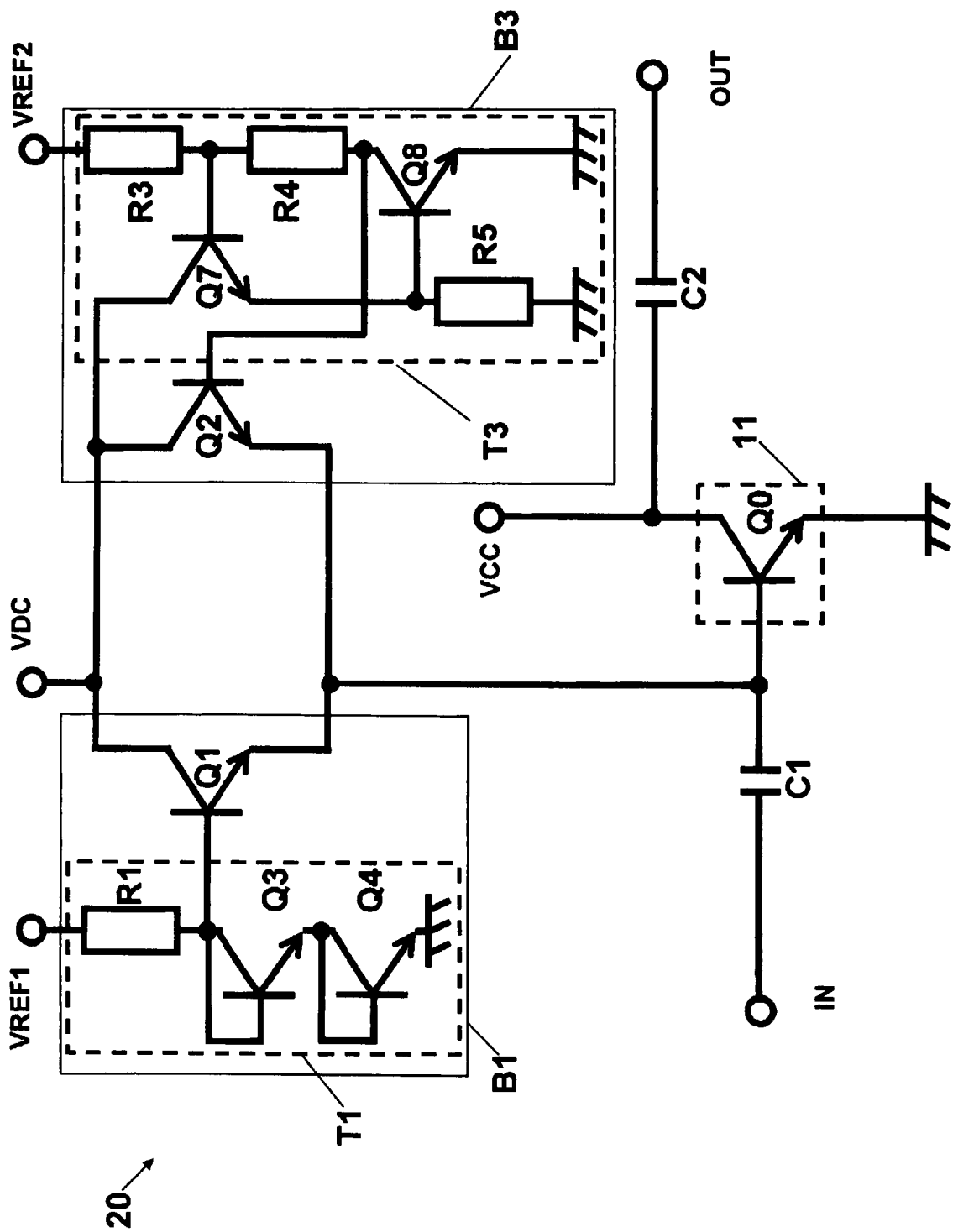
FIG. 7A is a circuit diagram of a circuit configuration of a high-frequency power amplifier 20 according to a second embodiment of the invention (showing when the circuit configuration is applied to a low power output bias circuit).
Figure 7B:
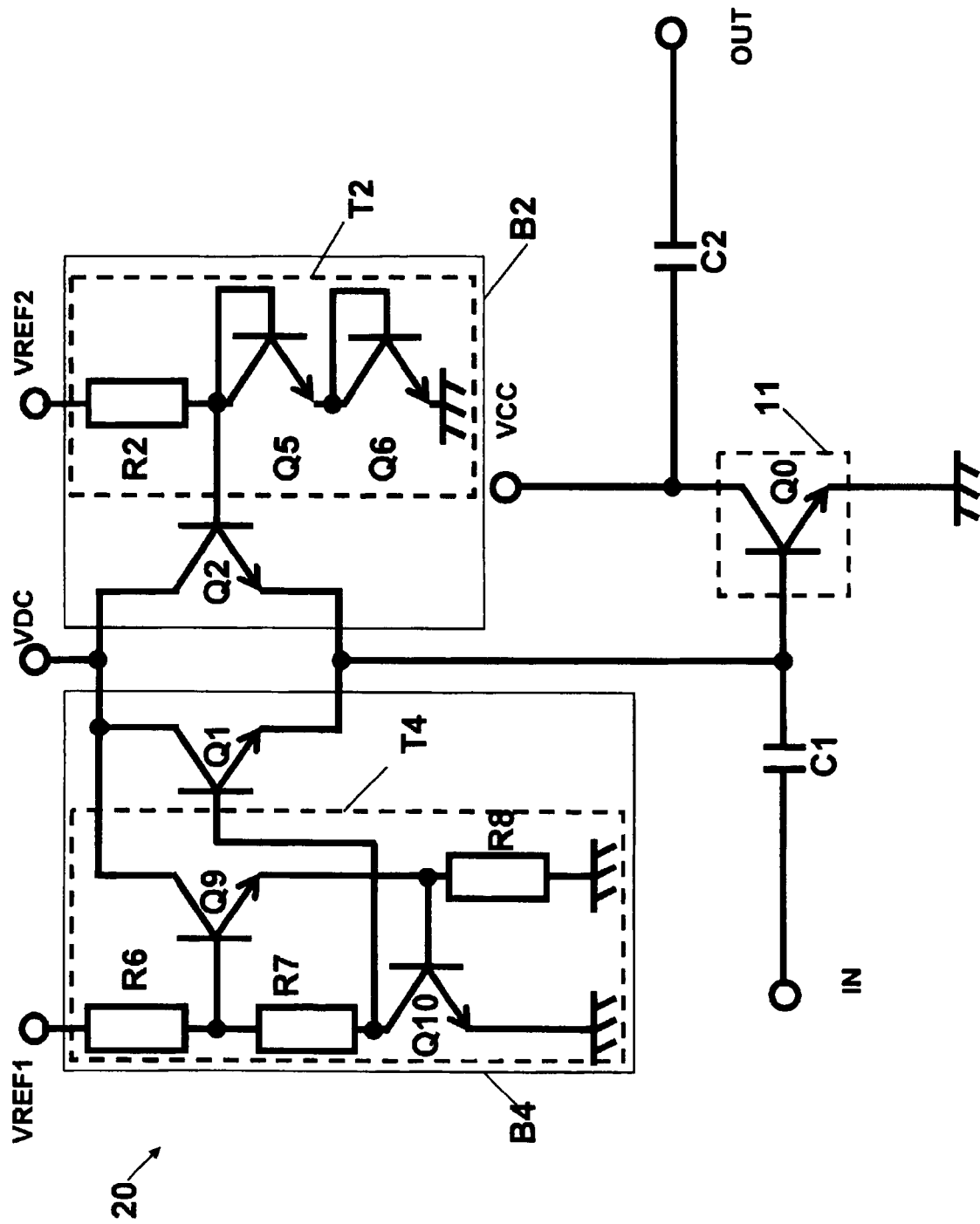
FIG. 7B is a circuit diagram of a circuit configuration of a high-frequency power amplifier 20 according to a second embodiment of the invention (showing when the circuit configuration is applied to a high power output bias circuit).
Figure 7C:
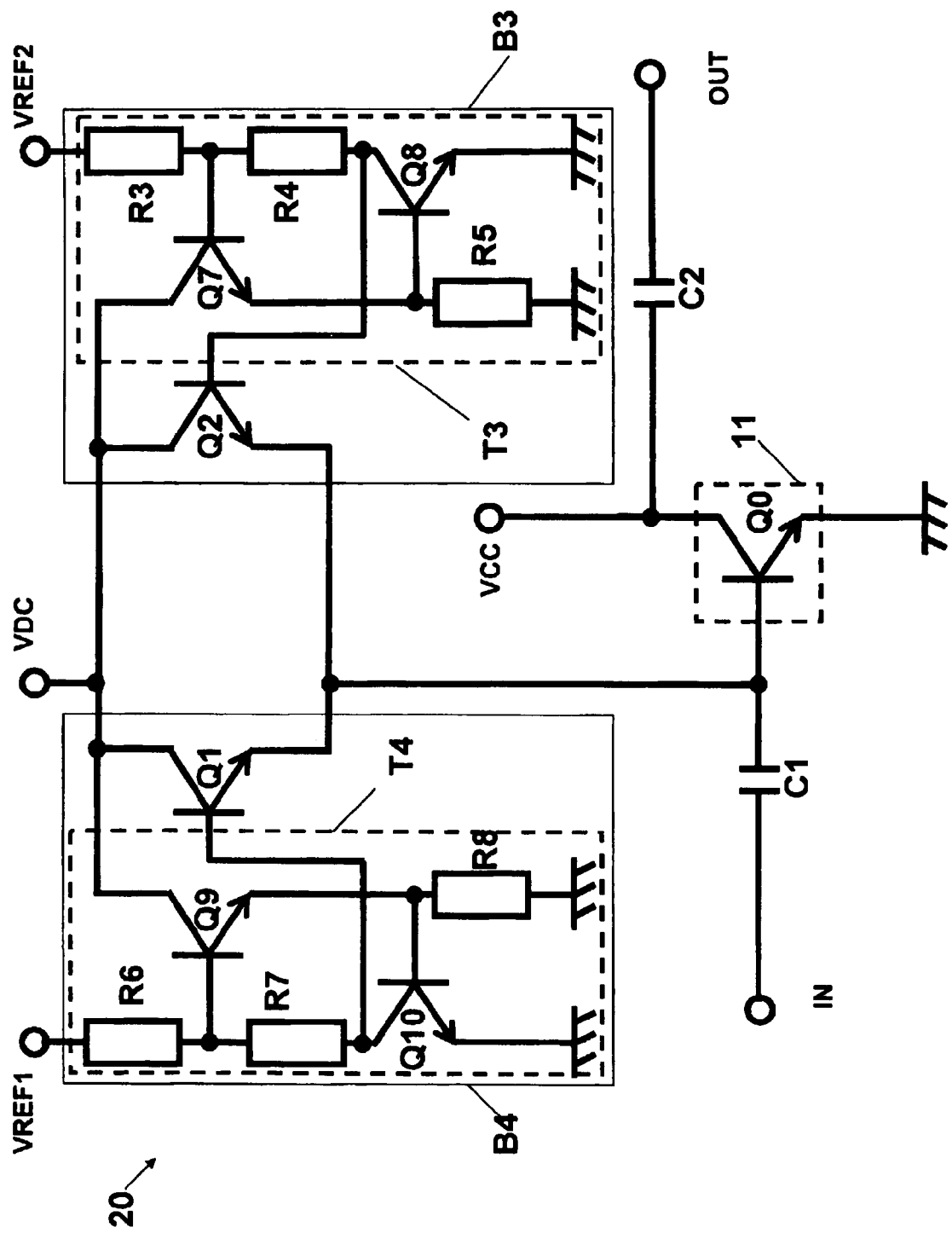
FIG. 7C is a circuit diagram of a circuit configuration of a high-frequency power amplifier 20 according to a second embodiment of the invention (showing when the circuit configuration is applied to a low/high power output bias circuit).

FIGS. 7A~7C respectively show examples of the circuit configurations of a high-frequency power amplifier 20 according to the second embodiment of the invention. Specifically, FIG. 7A is a circuit diagram of a circuit configuration in which a temperature compensation circuit depending little on the reference voltage VREF is provided so as to correspond to a low power output bias circuit; FIG. 7B is a circuit diagram of a circuit configuration in which a temperature compensation circuit depending little on the reference voltage VREF is provided so as to correspond to a high power output bias circuit; and, FIG. 7C is a circuit diagram of a circuit configuration in which a temperature compensation circuit depending little on the reference voltage VREF is provided so as to correspond to a high power output/low power output bias circuit.

Now, description will be given below of, as a representative of the high-frequency power amplifier 20 according to the second embodiment of the invention, the structure and operation of the high-frequency power amplifier (FIG. 7A) in which the temperature compensation circuit depend little on the reference voltage VREF is used in association with the low power output bias circuit.

In FIG. 7A, the high-frequency power amplifier 20 comprises an RF amplifier 11, capacitors C1 and C2, a high power output bias circuit B1, and a low power output bias circuit B3. As can be seen from FIG. 7A, the structure of the high-frequency power amplifier 20 according to the second embodiment is different from that of the high-frequency power amplifier 10 (FIG. 3) according to the first embodiment in that it uses the low power output bias circuit B3 including a temperature compensation circuit T3 depending little on the reference voltage VREF. The other remaining portions of the power amplifier 20 are the same as the power amplifier 10.

The low power output bias circuit B3 is composed of a biasing transistor Q2 and temperature compensation circuit T3, while the temperature compensation circuit T3 is composed of resistors R3, R4 and R5, and transistors Q7, Q8. The resistors R3 and R4 are connected in series to each other; and the base of the transistor Q7 is connected to the connecting point between the resistors R3 and R4. A reference voltage VREF2 is connected to the resistor R3; and the collector of the transistor Q8 with its emitter grounded and the base of the biasing transistor Q2 are connected to the resistor R4, respectively. The collector of the transistor Q7 is connected to the collector of the biasing transistor Q2 and a bias voltage terminal VDC, and the emitter of the transistor Q7 is connected to the base of the transistor Q8 and a grounding resistor R5.

Here, while the temperature compensation circuit T3 has current supply ability equivalent to the temperature compensation circuit T2 of the high-frequency power amplifier 10 according to the first embodiment of the invention, the sensitivity of voltage supplied to the base of the biasing transistor Q2 owing to the reference voltage VREF 2 is set lower than the temperature compensation circuit T2.

For example, in the present embodiment, the resistance value of each of the resistors R3 and R5 is set one half the resistance value of the resistor R2 according to the first embodiment of the invention, and the resistance value of the resistor R4 is set 1/10 of the resistance value of the resistor R3. By interposing the resistor R4 between the resistor R3 and the collector of the transistor Q8 and also by supplying a voltage from the connecting point of the resistors R3 and R4 to the base of the transistor Q7, a variation of the voltage in the base of the biasing transistor Q2 can be adjusted to be 1/10 of a variation in the reference voltage VREF through the resistance division of the resistors R3 and R4. By the way, the transistors Q7 and Q8 provided in the compensation circuit T3 respectively have the same emitter size as the transistors Q9 and Q10 provided in the temperature compensation circuit T2 according to the first embodiment of the invention.

The temperature compensation of the temperature compensation circuit T3 is equivalent to that of the high-frequency power amplifier 10 according to the first embodiment of the invention. A variation in the collector current during the idle time in the low power output mode, as shown in FIG. 5, is set in the range of 21 mA (at the time of −10° C.) to 29 mA (at the time of +55° C.), and the variation in the collector current is controlled in the range of −15% to +15% with respect to 25 mA at the time of +25° C.

That is, even when the peripheral temperature varies, a variation in the inter-base-emitter voltage Vbe of the power amplifying transistor Q0 of the RF amplifier 11 and a variation in the inter-base-emitter voltage Vbe of the biasing transistor Q2 are compensated by the temperature compensation circuit T3 which uses not only the inter-base-emitter voltage Vbe of the transistors Q7 and Q8 provided in the low power output bias circuit B3 but also a voltage drop amount in the resistor. R4, whereby a variation in the base current of the power amplifying transistor Q0 of the RF amplifier 11 is controlled.

Figure 10:
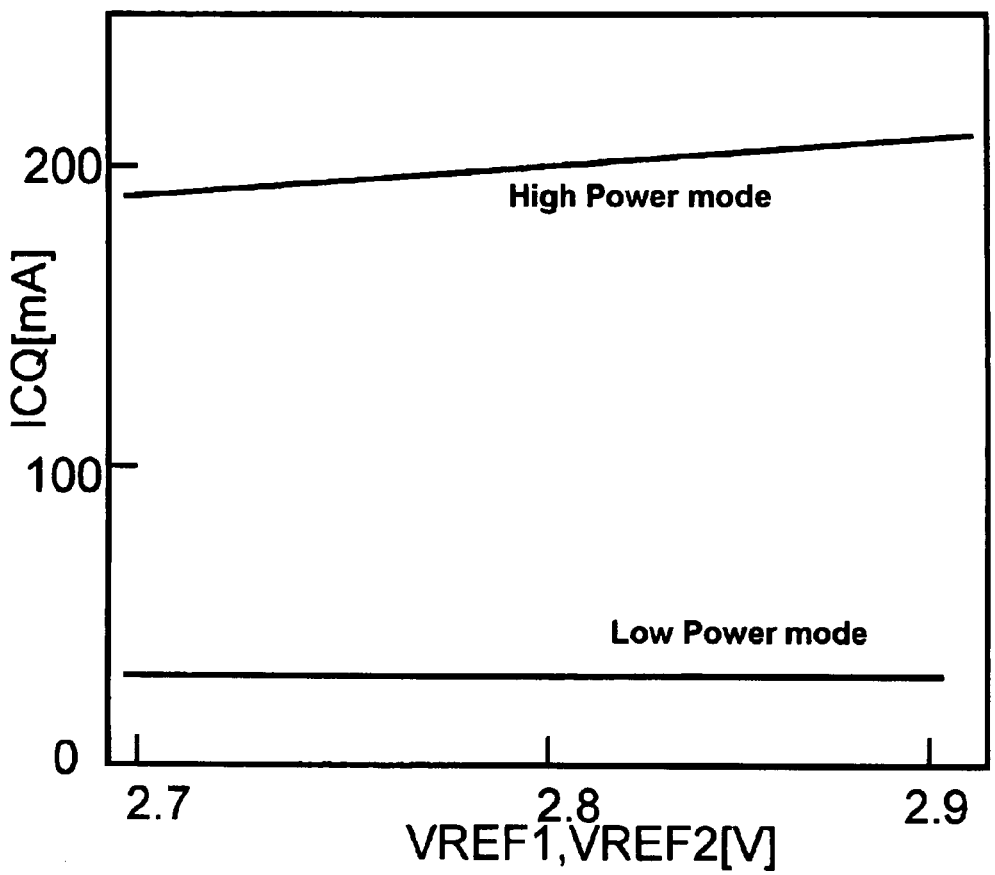
FIG. 10 is a graphical representation of an example of the dependence of an idle current on the reference voltages VREF1, VREF2 when the respective bias circuits of the high-frequency power amplifier 10 shown in FIG. 3 are used.

According to this structure, the reference voltage VREF2 supplies a voltage from the connecting point of the resistors R3 and R4 to the base of the biasing transistor Q2 through the transistors Q7 and Q8. This can lower the voltage supply sensitivity of the reference voltage VREF2 and, therefore, such a variation in the collector current during the idle time caused by the reference voltages VREF1 and VREF2 as shown in FIG. 10, in the low power output mode, can be greatly reduced down to the range of about −2%~+2% with respect to the range of 24.5 mA (VREF2=2.716 V) to 25.5 mA (VREF2=2.884 V) as well as with respect to 25 mA at the time of VREF2=2.8 V.

By the way, in the high power output mode, since there is set the bias circuit B1 which is equivalent to the high-frequency power amplifier 10 according to the first embodiment of the invention, the variation is controlled in the range of about −10% to +10% with respect to the range of 180 mA (VREF1=2.716 V) to 220 mA (VREF1=2.884 V) and with respect to 200 mA at the time of VREF1=2.8 V.

Figure 11:
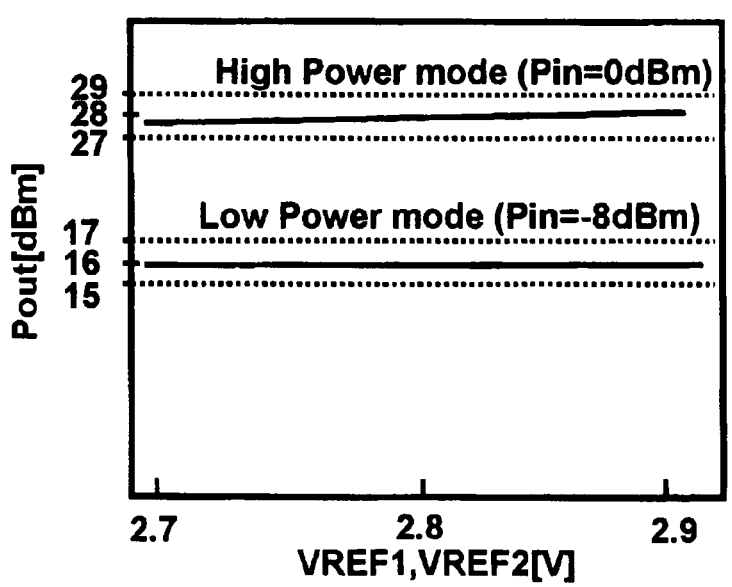
FIG. 11 is a graphical representation of the relationship between the reference voltages VREF1, VREF2 and output power in the high-frequency power amplifier 20 shown in FIG. 7A.

Now, FIG. 11 shows the output power (power gain) characteristics of the above-mentioned high-frequency power amplifier 20 according to the second embodiment of the invention with respect to variations caused by the reference voltages VREF1 and VREF2 when the high-frequency power amplifier 20 is used in the rear stage of a cascade-connected two-stage power amplifier, in a high power output mode (28 dBm) and in a low power output mode (16 dBm). When the bias voltage varies in the range of 2.716 V to 2.884 V, in the low power output mode, a variation in the collector current is ±2% and the output power of the high-frequency power amplifier 20 varies in the range of 15.9 dBm to 17.1 dBm. Therefore, even when the peculiar variation and temperature variation of the high-frequency power amplifier 20 are taken into account, the output power can be positively controlled within ±1 dB.

By the way, in the high power output mode, since there is set the bias circuit B1 which is equivalent to the high-frequency power amplifier 10 according to the first embodiment of the invention, and also since the variation in the collector current is controlled within ±10%, the output power of the high-frequency power amplifier 20 is allowed to vary in the range of 27.5 dBm to 28.5 dBm and thus the output power can be easily controlled within ±1 dB.

As described above, according to the high-frequency power amplifier of the second embodiment of the invention, a temperature compensation circuit depending little on the reference voltage VREF is provided so as to correspond to the low power output bias circuit. This can provide a high-frequency power amplifier which not only can provide a high power added-efficiency over a wide range of output power of the power amplifier but also, regardless of a variation in the output power, can provide a output power characteristic depending little on the temperature as well as little depending on a variation in the reference voltage VREF. This can realize a high quality talk in a cellular phone terminal.

By the way, in the above-mentioned second embodiment, description has been given of the structure in which a temperature compensation circuit depending little on the reference voltage VREF is provided in association with the low power output bias circuit. However, this is not limitative but, according to the uses and temperature characteristics of the high-frequency power amplifier, a temperature compensation circuit depending little on the reference voltage VREF may be provided in association with the high power output bias circuit, and a temperature compensation circuit depending little on the reference voltage VREF may be provided in association with a high power output/low power output bias circuit.

Third Embodiment

In the structure described above in relation to the high-frequency power amplifier 10 according to the above-mentioned first embodiment, a temperature compensation circuit T1 is provided in association with a high power output bias circuit B1, and a temperature compensation circuit T2 is provided in association with a low power output bias circuit B2; the reference voltages VREF1 and VREF2 are applied to these temperature compensation circuits T1 and T2; and the voltage of a bias voltage terminal VDC is applied to biasing transistors Q1 and Q2 in common. The current flowing in the VDC terminal increases as the output power increases and, at the time of output power of 28 dBm, a current of about 5 mA flows.

Figure 13:
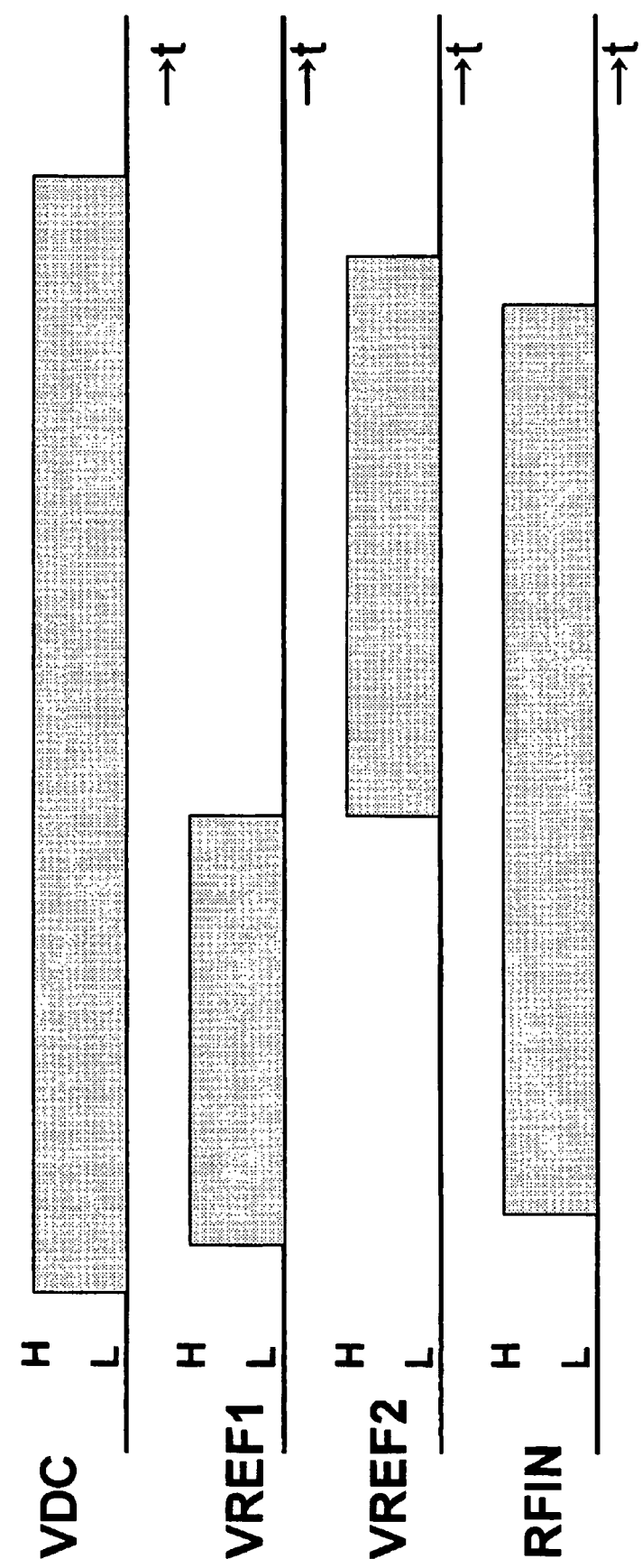
FIG. 13 is a view of an example of the control timing of voltages and a high-frequency signal to be controlled when the high-frequency power amplifier 10 shown in FIG. 3 is used.

However, in order to put the high-frequency power amplifier 10 into operation actually, the control voltages VREF1, VREF2 and VDC must be controlled according to such a timing chart as shown in FIG. 13.

That is, in order to operate the high-frequency power amplifier 10 with high efficiency and with proper temperature characteristic in a wide range of the output power thereof, there are necessary the three control voltages. Firstly, after the voltage of the bias voltage terminal VDC is applied in the form of a voltage of 1.5 V or higher. After then, in the high power output mode, the voltage of the control voltage VREF1 is applied as a voltage of 2.5V or higher, and the voltage VREF2 is applied as a voltage of 0V. In the low power output mode, after the voltage VREF2 is switched to a voltage of 2.5 V or higher and the voltage of the terminal VREF1 is switched to a voltage of 0V, they are applied respectively.

And, after application of the above-mentioned bias voltage and reference voltages, a high-frequency signal RFIN is input to thereby operate the high-frequency power amplifier 10 for power amplification. This means that the high-frequency power amplifier 10 requires three voltage control systems. However, this raises a fear that the actual loading area of a cellular phone terminal as well as the cost thereof can be increased. And, the control of the cellular phone terminal is complicated. This makes it necessary to provide a control correction table within the cellular phone terminal, which in turn may raise a possibility that the memory of the cellular phone terminal must be increased.

In view of the above, according to the third embodiment, description will be given below of a high-frequency power amplifier having a structure using bias circuits which can reduce the number of systems for applying control voltages.

Figure 12:
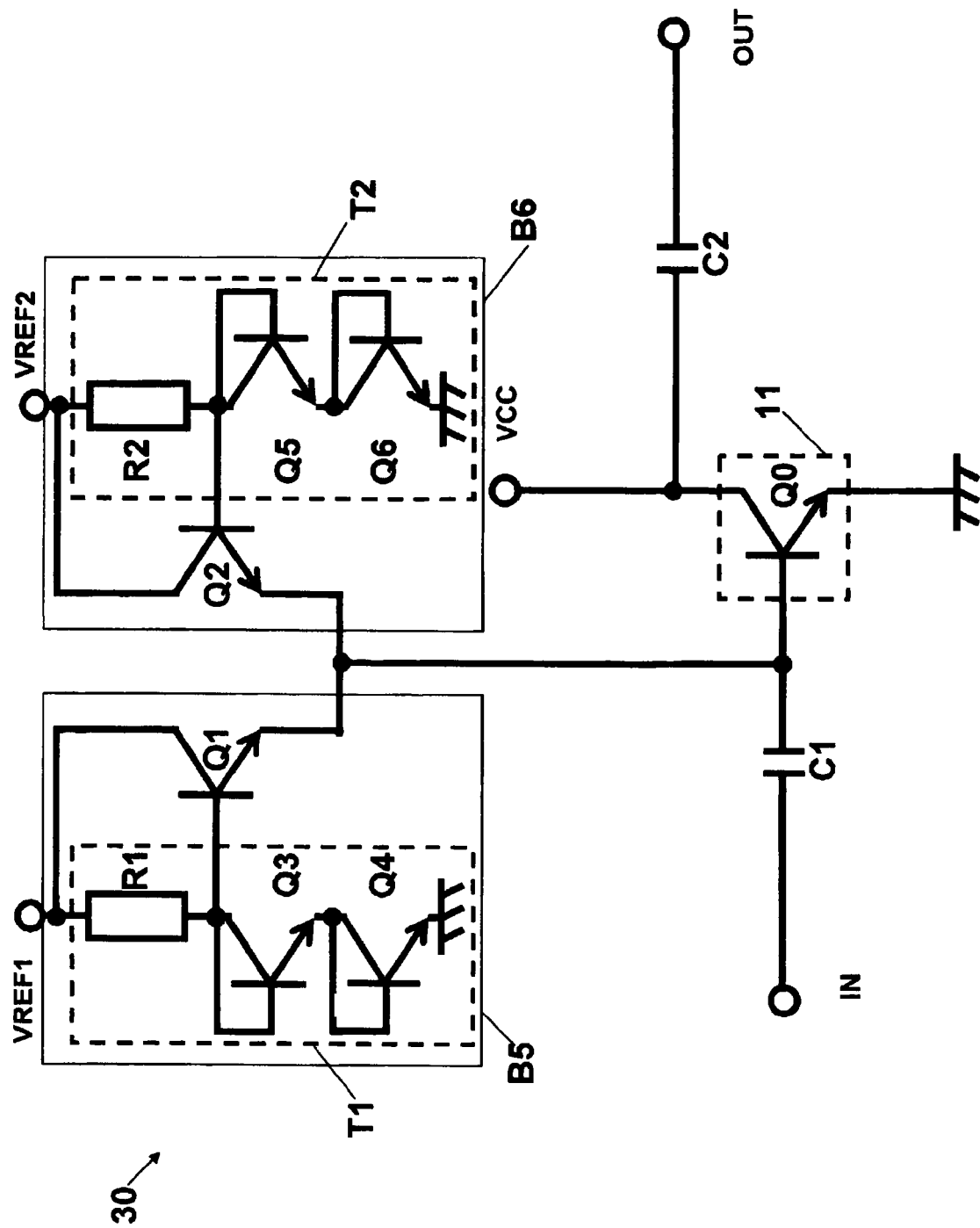
FIG. 12 is a circuit diagram of a circuit configuration of a high-frequency power amplifier 30 according to a third embodiment of the invention.

FIG. 12 shows a circuit diagram of an example of the circuit configuration of a high-frequency power amplifier 30 according to the third embodiment of the invention. Description will be given below of the structure and operation of a high-frequency power amplifier which does not use the bias voltage terminal VDC in the high and low power output bias circuits but uses only the reference voltages VREF1 and VREF2.

In FIG. 12, the high-frequency power amplifier 30 comprises an RF amplifier 11, capacitors C1 and C2, a high power output bias circuit B5, and a low power output bias circuit B6. As can be seen from FIG. 12, the structure of the high-frequency power amplifier 30 according to the third embodiment of the invention is different from the structure (FIG. 3) of the high-frequency power amplifier 10 according to the first embodiment in that there is eliminated the provision of the bias voltage terminal VDC and there are used the high power output bias circuit B5 actuatable only by the reference voltage VREF1 and the low power output bias circuit B6 actuatable only by the reference voltage VREF2. The other remaining portions of the structure of the high-frequency power amplifier 30 are the same as that of the high-frequency power amplifier 10.

The high power output bias circuit B5 is composed of a biasing transistor Q1 and a temperature compensation circuit T1, while the temperature compensation circuit T1 is composed of a resistor R1 and two transistors Q3 and Q4 connected in series to the resistor R1, with the base and collector thereof connected to each other by a wire. The reference voltage VREF1 is applied to the resistor R1; the emitter of the transistor Q4 is grounded; the base of the biasing transistor Q1 is connected to the connecting point between the resistor R1 and the collector of the transistor Q3; the resistor R1 is connected to the collector of the biasing transistor Q1 and the reference voltage VREF1 is applied to the resistor R1; and the emitter of the biasing transistor Q1 is connected to a power amplifying transistor Q0.

The low output bias circuit B6 is composed of a biasing transistor Q2 and a temperature compensation circuit T2, while the temperature compensation circuit T2 is composed of a resistor R2 and two transistors Q5 and Q6 connected in series to the resistor R2, with the base and collector thereof connected to each other by a wire. The reference voltage VREF2 is applied to the resistor R2; the emitter of the transistor Q6 is grounded; the base of the biasing transistor Q2 is connected to the connecting point between the resistor R2 and the collector of the transistor Q5; the resistor R2 is connected to the collector of the biasing transistor Q2 and the reference voltage VREF2 is applied to the resistor R2; and the emitter of the biasing transistor Q2 is connected to the power amplifying transistor Q0.

Here, the bias circuits B5 and B6 are respectively equal in the current supply ability to the bias circuits of the high-frequency power amplifier 10 according to the first embodiment of the invention. On the other hand, a power supply (DA converter), which is used in the reference voltages VREF1 and VREF2, must have such current capacity that is larger by an amount of a current flowing in the biasing transistors Q1 and Q2 than the power amplifier 10.

For example, according to the present embodiment, a power supply (DA converter) to be used for the reference voltage terminal VREF1 must have current capacity of 5 mA or larger because it is used for a high power output; and, a power supply (DA converter) to be used for the reference voltage VREF2 must have current capacity of 1 mA or larger because it is used for a low power output.

By the way, the transistors Q1~Q6 and resistors R1, R2 provided in the bias circuits B5 and B6 are respectively equal in the emitter size and resistance value to the transistors Q1~Q6 and resistors R1, R2 provided in the bias circuits B1 and B2 according to the first embodiment of the invention.

Figure 14:
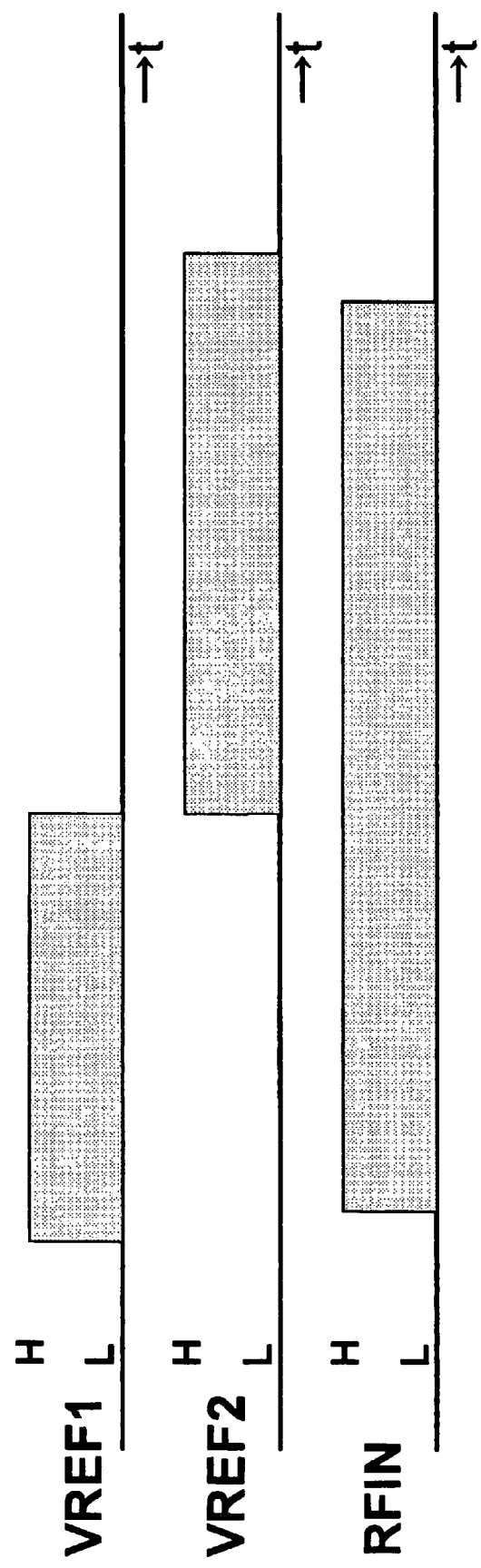
FIG. 14 is a view of an example of the control timing of a voltage and a high-frequency signal to be controlled when the high-frequency power amplifier 30 shown in FIG. 12 is used.
Figure 15:
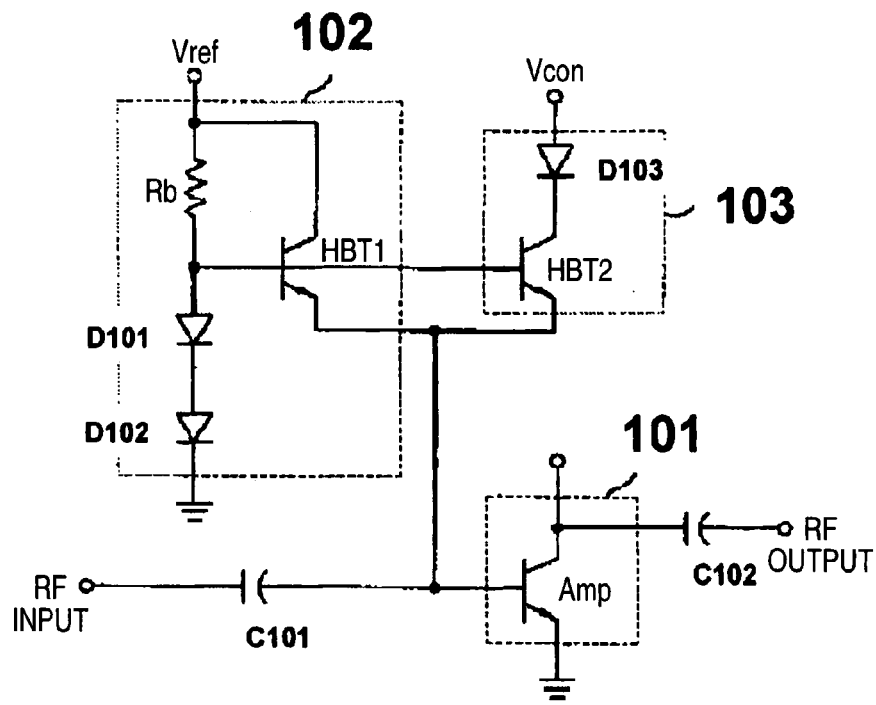
FIG. 15 is a circuit diagram of a circuit configuration of a conventional high-frequency power amplifier 100.
Figure 16:
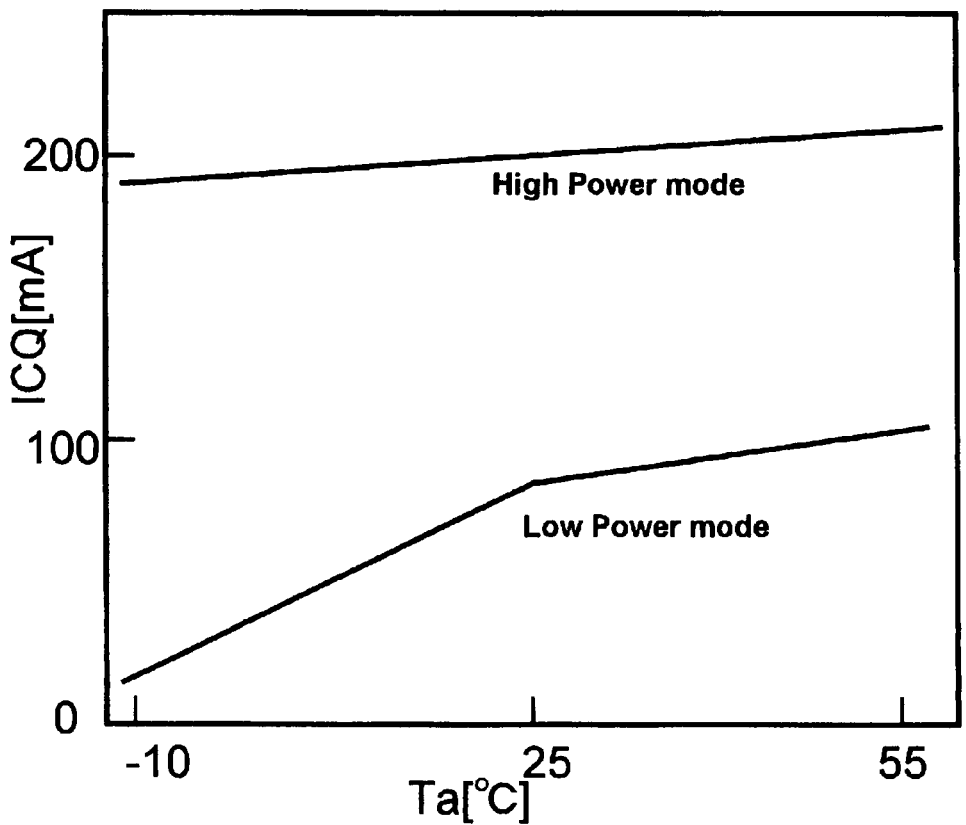
FIG. 16 is a graphical representation of the temperature characteristic of an idle current when the bias current control circuit of the high-frequency power amplifier 100 shown in FIG. 15 is switched.
Figure 17:
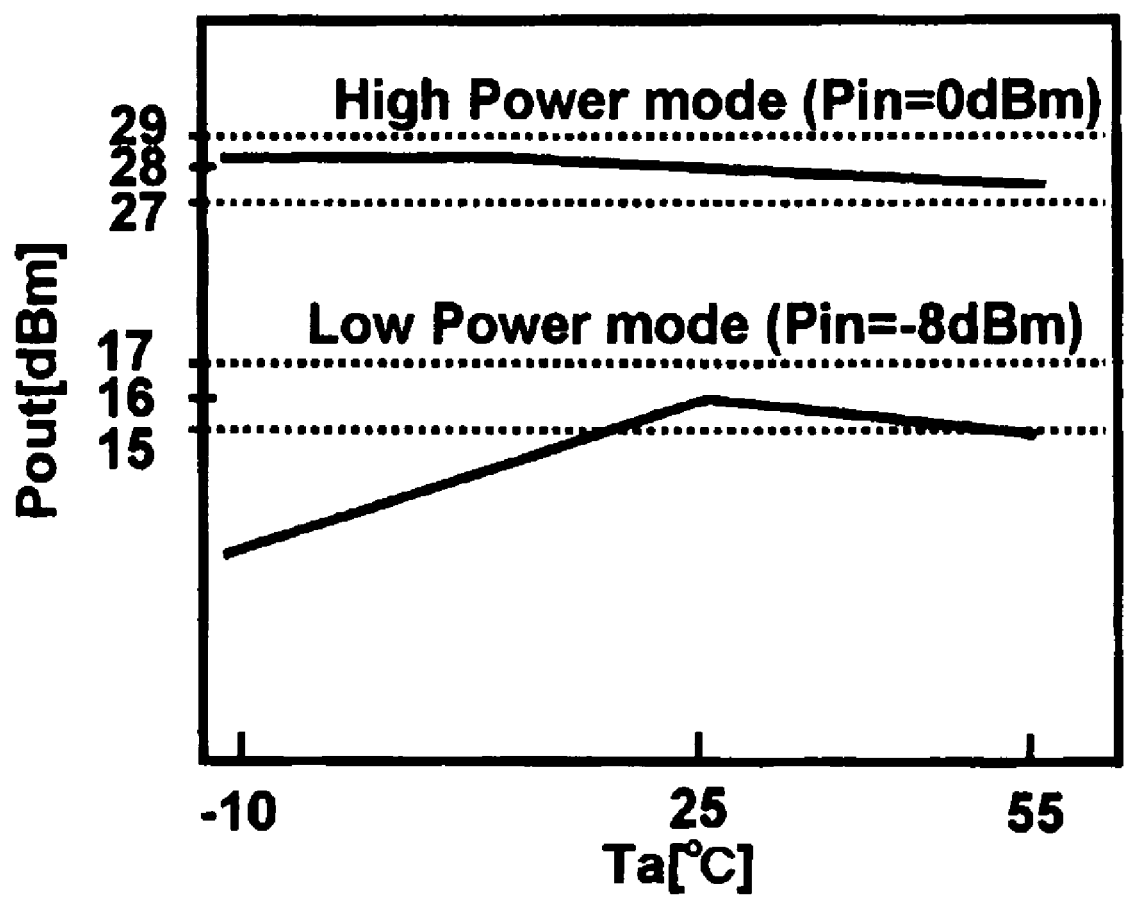
FIG. 17 is a graphical representation of the relationship between the peripheral temperature and output power in the high-frequency power amplifier 100 shown in FIG. 15.

According to this structure, since the driving and switching of the high and low power output modes can be carried out only by the reference voltages VREF1 and VREF2, the high-frequency power amplifier 30 can be controlled according to such a timing chart as shown in FIG. 14.

That is, in order to operate the high-frequency power amplifier 30 with high efficiency and with proper temperature characteristic in a wide range of the output power thereof, there are used only the two bias voltages. Specifically, in the high power output mode, the reference voltage VREF1 is applied after it is switched to a voltage of 2.5 V or higher, and the reference voltage VREF2 is applied after it is switched to a voltage of 0V; and, in the low power output mode, the reference voltage VREF2 is applied after it is switched to a voltage of 2.5 V or higher, and the reference voltage VREF1 is applied after it is switched to a voltage of 0 V before they are applied. And, after application of these control voltages, a high-frequency signal RFIN is input to the high-frequency power amplifier 30 for power amplification.

As described above, according to the high-frequency power amplifier of the third embodiment of the invention, since there may be prepared only two systems for controlling the voltages, not only the actual mounting area of a cellular phone terminal and the cost thereof can be reduced, but also the control of the cellular phone terminal can be simplified. This can eliminate the need for provision of a control correction table within the cellular phone terminal and thus the memory size of the cellular phone terminal can be reduced.

In the case of the high-frequency power amplifiers discussed in the above-mentioned first, second and third embodiments, description has been given of a case in which each of them is used in the rear stage of a cascade-connected two-stage power amplifier. However, this is not limitative but the high-frequency power amplifier according to the invention can also be used in the front stage of a cascade-connected two-stage power amplifier. Further, it may also be used in any stage of a cascade-connected n-stage power amplifier (n is an integral number).

In addition, the above-mentioned high-frequency power amplifier can be used not only in the UMTS system but also in other various mobile telephone systems (such as CDMA (IS-959), GSM, EDGE, WCDMA, PCS, DCS, PDC, CDMA2000, PHS AND W-LAN).

A high-frequency power amplifier according to the invention can be used in an apparatus (for example, a cellular phone terminal) using a bipolar transistor for transmission and reception of a high-frequency signal and, especially, it is suitable when a high-efficiency operation is to be realized stably with little output variation over a wide range of output power even in a case where the temperature varies.

What is claimed is:

1. A high-frequency power amplifier with a temperature compensation function for power amplifying a high-frequency signal, the amplifier comprising:
   a power amplifying transistor having an emitter grounded;
   a high power output bias circuit that supplies a high power output current corresponding to a high power output of the high-frequency power amplifier to the power amplifying transistor; and
   a low power output bias circuit that supplies a low power output current corresponding to a low power output of the high-frequency power amplifier to the power amplifying transistor.

2. The amplifier according to claim 1 further comprising:
   a capacitor including one electrode for receiving a high-frequency signal and the other electrode connected to a base of the power amplifying transistor; and
   a capacitor having one electrode connected to the collector of the power amplifying transistor with the other electrode for outputting a high-frequency signal,
   wherein the high power output bias circuit includes a first electrode connected to a first reference voltage apply terminal, a second electrode connected to a bias voltage apply terminal, and a third electrode connected to the base of the power amplifying transistor, and
   wherein the low power output bias circuit includes a fourth electrode connected to a second reference voltage apply terminal, a fifth electrode connected to the bias voltage apply terminal, and a sixth electrode connected to the base of the power amplifying transistor.

3. The amplifier according to claim 2, wherein
   the high power output bias circuit includes a first temperature compensation circuit for compensating temperature of the high power output current and a first biasing transistor for supplying the temperature compensated high power output current to the base of the power amplifying transistor, and
   the low power output bias circuit includes a second temperature compensation circuit for compensating temperature of the low power output current and a second biasing transistor for supplying the temperature compensated low power output current to the base of the power amplifying transistor.

4. The amplifier according to claim 3, wherein an idle current of the power amplifying transistor to be operated by the second biasing transistor at the time of the low power output is smaller than the idle current of the power amplifying transistor to be operated by the first biasing transistor at the time of the high power output.

5. The amplifier according to claim 4, wherein a variation coefficient of the idle current of the power amplifying transistor to be compensated by the first temperature compensation circuit when the temperature at the time of the high power output varies is equivalent to a variation coefficient of the idle current of the power amplifying transistor to be compensated by the second temperature compensation circuit when the temperature at the time of the low power output varies.

6. The amplifier according to claim 3, wherein
the first temperature compensation circuit includes a resistor connected between the first reference voltage apply terminal and the base of the first biasing transistor, and first and second diodes connected in series to each other, each diode having an anode connected to the base of the first biasing transistor and a cathode grounded;
the first biasing transistor includes a collector connected to the bias voltage apply terminal and an emitter connected to the base of the power amplifying transistor;
the second temperature compensation circuit includes a resistor connected between the second reference voltage apply terminal and the base of the second biasing transistor, and third and fourth diodes connected in series to each other, each diode having an anode connected to the base of the second biasing transistor and a cathode grounded; and
the second biasing transistor has a collector connected to the bias voltage apply terminal and an emitter connected to the base of the power amplifying transistor.

7. The amplifier according to claim 3, at least one of the variation coefficient of the idle current of the power amplifying transistor to be compensated by the first temperature compensation circuit when the output power of the high-frequency power amplifier is a high power and the reference voltage varies, and the variation coefficient of the idle current of the power amplifying transistor to be compensated by the second temperature compensation circuit when the output power is a low power and the reference voltage varies is small.

8. The amplifier according to claim 1 further comprising:
a capacitor including one electrode for receiving a high-frequency signal and the other electrode connected to the base of the power amplifying transistor; and
a capacitor including one electrode connected to the collector of the power amplifying transistor and the other electrode for receiving a high-frequency signal,
wherein the high power output bias circuit includes one electrode connected to the first reference voltage apply terminal and the other electrode connected to the base of the power amplifying transistor, and
wherein the low power output bias circuit includes one electrode connected to the second reference voltage apply terminal and the other electrode connected to the base of the power amplifying transistor.

9. The amplifier according to claim 8, wherein
the high power output bias circuit includes a first temperature compensation circuit for compensating the temperature of the high power output current and a first biasing transistor for supplying the temperature compensated high power output current to the base of the power amplifying transistor, and
the low power output bias circuit includes a second temperature compensation circuit for compensating the temperature of the low power output current and a second biasing transistor for supplying the temperature compensated low power output current to the base of the power amplifying transistor.

10. The amplifier according to claim 9, wherein the idle current of the power amplifying transistor to be operated by the second biasing transistor at the time of the low power output is smaller than the idle current of the power amplifying transistor to be operated by the first biasing transistor at the time of the high power output.

11. The amplifier according to claim 10, wherein the variation coefficient of the idle current of the power amplifying transistor to be compensated by the first temperature compensation circuit when the temperature in the high power output time varies is equivalent to the variation coefficient of the idle current of the power amplifying transistor to be compensated by the second temperature compensation circuit when the temperature at the time of the low power output varies.

12. The amplifier according to claim 8, wherein the driving of the power amplifying transistor is controlled by applying a voltage to the first and second reference voltage apply terminals.

* * * * *